(12) United States Patent
Bukhari et al.

(10) Patent No.: US 12,079,065 B2
(45) Date of Patent: Sep. 3, 2024

(54) CACHING LOOKUP TABLES FOR BLOCK FAMILY ERROR AVOIDANCE

(71) Applicant: Micron Technology, Inc., Boise, ID (US)

(72) Inventors: Shakeel Isamohiuddin Bukhari, San Jose, CA (US); Mark Ish, Manassas, VA (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 17/931,937

(22) Filed: Sep. 14, 2022

(65) Prior Publication Data

US 2024/0069997 A1 Feb. 29, 2024

Related U.S. Application Data

(60) Provisional application No. 63/374,140, filed on Aug. 31, 2022.

(51) Int. Cl.
*G06F 11/00* (2006.01)
*G06F 12/02* (2006.01)
*G06F 12/12* (2016.01)

(52) U.S. Cl.
CPC ........ *G06F 11/004* (2013.01); *G06F 12/0215* (2013.01); *G06F 12/12* (2013.01); *G06F 2212/251* (2013.01)

(58) Field of Classification Search
None
See application file for complete search history.

(56) References Cited

U.S. PATENT DOCUMENTS

| | | | |
|---|---|---|---|
| 11,211,128 B1 * | 12/2021 | Sheperek | G11C 16/30 |
| 11,217,320 B1 * | 1/2022 | Sheperek | G11C 16/30 |
| 11,347,434 B2 | 5/2022 | Ish | |
| 2021/0191617 A1 * | 6/2021 | Sheperek | G06F 3/0604 |
| 2021/0326069 A1 * | 10/2021 | Ish | G06F 3/0659 |
| 2022/0050777 A1 * | 2/2022 | Sheperek | G01R 19/16538 |
| 2022/0066639 A1 * | 3/2022 | Sheperek | G06F 3/0604 |
| 2022/0068396 A1 * | 3/2022 | Rayaprolu | G11C 16/107 |
| 2022/0083243 A1 * | 3/2022 | Muchherla | G06F 3/0679 |
| 2022/0083463 A1 * | 3/2022 | Muchherla | G11C 16/3427 |

(Continued)

FOREIGN PATENT DOCUMENTS

EP 4002129 A1 * 5/2022 ......... G06F 12/0246

*Primary Examiner* — Kevin Verbrugge
(74) *Attorney, Agent, or Firm* — Harrity & Harrity, LLP

(57) ABSTRACT

In some implementations, a memory device may cache a subset of one or more block family error avoidance (BFEA) lookup tables associated with a block family associated with host data in a first memory location. The block family may be based on at least one of a time window during which the host data was written or a temperature window at which the host data was written. The memory device may receive a read command associated with host data and determine, based on the block family and the subset of the one or more BFEA tables, a threshold voltage offset associated with the host data. The memory device may compute a modified threshold voltage by applying the threshold voltage offset to a base read level voltage associated with the host data. The memory device may read, using the modified threshold voltage, the host data from the first memory location.

25 Claims, 17 Drawing Sheets

(56) References Cited

U.S. PATENT DOCUMENTS

| | | | |
|---|---|---|---|
| 2022/0084605 A1* | 3/2022 | Muchherla | G11C 16/34 |
| 2022/0129154 A1* | 4/2022 | Nowell | G11C 11/5642 |
| 2022/0137814 A1* | 5/2022 | Nowell | G06F 3/0659 |
| | | | 711/103 |
| 2022/0137815 A1* | 5/2022 | Nowell | G11C 29/028 |
| | | | 711/103 |
| 2022/0164105 A1* | 5/2022 | Nowell | G06F 3/0629 |

* cited by examiner

CACHING LOOKUP TABLES FOR BLOCK FAMILY ERROR AVOIDANCE

CROSS-REFERENCE TO RELATED APPLICATION

This patent application claims priority to U.S. Provisional Patent Application No. 63/374,140, filed on Aug. 31, 2022, and entitled "CACHING LOOKUP TABLES FOR BLOCK FAMILY ERROR AVOIDANCE." The disclosure of the prior application is considered part of and is incorporated by reference into this patent application.

TECHNICAL FIELD

The present disclosure generally relates to memory devices, memory device operations, and, for example, to caching lookup tables for block family error avoidance.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, an electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

DETAILED DESCRIPTION

Figure 1:
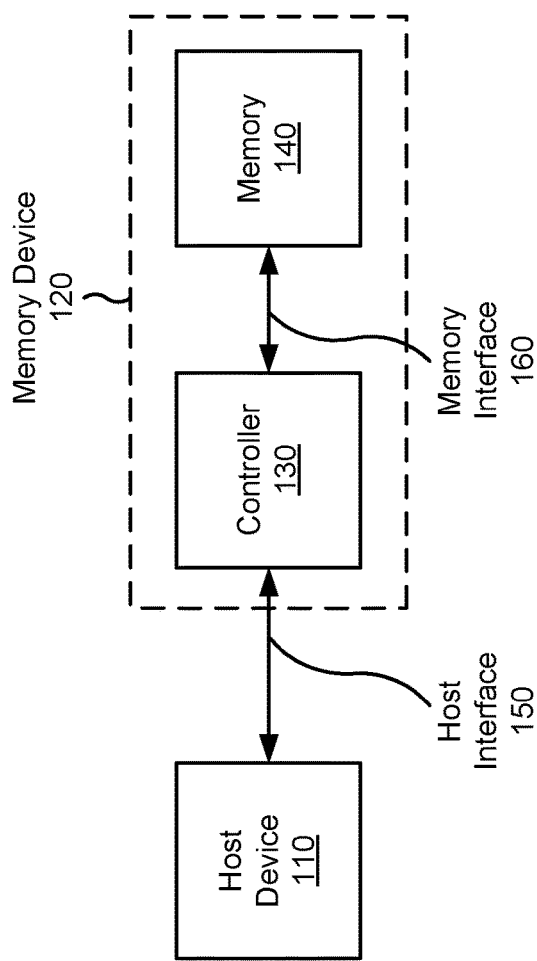
FIG. 1 is a diagram illustrating an example system capable of caching lookup tables for block family error avoidance (BFEA) schemes.

A memory device may utilize memory, including any combination of non-volatile memory arrays and/or volatile memory arrays, to store data provided by a host device. In some implementations, non-volatile memory devices can be provided by negative-and (NAND) type flash memory devices. Other examples of non-volatile memory devices are described below in connection with FIG. 1. A non-volatile memory device is a package of one or more die. Each die may consist of one or more planes. Planes may be grouped into logic units (LUNs). For some types of non-volatile memory devices (e.g., NAND devices), each plane consists of a set of physical blocks. Each block consists of a set of pages. Each page consists of a set of memory cells (sometimes referred to herein simply as "cells"). A cell may be an electronic circuit that stores information.

Data operations may be performed by the memory device. The data operations may be host-device-initiated operations. For example, the host device may initiate a data operation (e.g., a write command, a read command, or an erase command, among other examples) on a memory device. The host device may send access requests (e.g., a write command or a read command) to the memory device, such as to store data on a memory at the memory device and/or to read data from the memory on the memory device. The data to be read or written, as specified by a host-device request, may be referred to as "host data." A host device request may include logical address information (e.g., a logical block address (LBA), or a namespace, among other examples) for the host data, which may be the location that the host device associates with the host data. The logical address information (e.g., the LBA, the namespace, or the like) may be part of metadata for the host data. Metadata may also include error handling data (e.g., error-correcting code (ECC) codewords, parity codes, or the like), data version (e.g., used to distinguish age of data written), or valid bitmap (e.g., indicating which LBAs or logical transfer units contain valid data), among other information.

As described in more detail below in connection with FIG. 3, a memory may include multiple memory cells, each of which may be capable of storing one or more bits of information, depending on the memory cell type. A memory cell may be programmed (e.g., written to) by applying a certain voltage to the memory cell, which may result in an electric charge being held by the memory cell, thus allowing modulation of the voltage distributions produced by the memory cell. Moreover, precisely controlling the amount of the electric charge stored by the memory cell may establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein may refer to the voltage level that defines a boundary between two neighboring voltage distributions corresponding to two logical levels. Thus, the read operation may be performed by comparing the measured voltage exhibited by the memory cell to one or more reference voltage levels in order to distinguish between two logical levels for single-level cells and between multiple logical levels for multi-level cells.

Due to the phenomenon known as slow charge loss (SCL), the threshold voltage of a memory cell may change over time as the electric charge of the cell is degrading, which sometimes may be referred to as "temporal voltage shift" (since the degrading electric charge causes the voltage distributions to shift along the voltage axis towards lower voltage levels). The threshold voltage may change rapidly at first (e.g., immediately after the memory cell is programmed), and then may slow down in an approximately logarithmic linear fashion with respect to the time elapsed since the cell programming event. Accordingly, failure to mitigate the temporal voltage shift caused by the SCL may result in the increased bit error rate in read operations.

In some cases, a memory device may employ a block family error avoidance (BFEA) scheme to improve a bit error rate exhibited by the memory device. In BFEA schemes, the temporal voltage shift may be selectively tracked for programmed blocks grouped by block families, and appropriate voltage offsets, which are based on block affiliation with a certain block family, may be applied to base read levels in order to perform read operations. "Block family" may refer to a set of blocks (which may include one or more full and/or partial blocks (e.g., "partitions")) that have been programmed within a specified time window and a specified temperature window. Because the time elapsed after programming and temperature may be two of the main factors affecting the temporal voltage shift, all blocks and/or partitions within a single block family may be presumed to exhibit similar distributions of threshold voltages in memory cells, and thus may require the same voltage offsets to be applied to the base read levels for read operations. "Base read level" herein may refer to the initial threshold voltage level exhibited by the memory cell immediately after programming. In some implementations, base read levels may be stored in the metadata of the memory.

Block families may be created asynchronously with respect to block programming events. For example, a new block family may be created whenever a specified period of time (e.g., a predetermined number of minutes) has elapsed since creation of the last block family and/or whenever a reference temperature of memory cells has changed by more than a specified threshold value. The memory device controller may maintain an identifier of the active block family, which may be associated with one or more blocks as they are being programmed.

The memory device controller may periodically perform a calibration process in order to associate each die of every block family with one of the predefined threshold voltage offset bins, which is in turn may be associated with the voltage offset to be applied for read operations. The associations of blocks with block families and block families and die with threshold voltage offset bins may be stored in respective metadata tables maintained by the memory device controller.

In some examples, associations of full or partial blocks (partitions) with block families may be stored by a combination of a block family table and a linked list of partition groups. The block family table, which may be indexed by the block number, may store, for each block, the block family associated with the first partition of the block, the ending page offset of the first partition of the block, and a link to the first group of the partition (e.g., an index of the first group of the partition in the group table). Each group may include up to a predetermined number of partitions, such that the group table specifies, for each partition, its block family association, its ending page offset, and a skip page offset for implementing the binary search within each group.

Accordingly, in some examples, upon receiving a read command, the memory device controller may identify the block family associated with the memory page identified by the logical address specified by the read command, identify the threshold voltage offset bin associated with the block family and die on which the block resides, compute the new threshold voltage by additively applying the threshold voltage offset associated with the threshold voltage offset bin to the base read level, and perform the read operation using the new threshold voltage.

Performing one or more of these processes may be time-consuming and may consume large amounts of power and/or computing resources. For example, the lookup tables associating host data with block families, and in turn block families with threshold offset values, may be voluminous, thus requiring multiple cycles to locate an associated threshold offset value for a given read command.

Some implementations described herein enable caching lookup information in a single-cycle access memory or similar memory location coupled to a controller. In some implementations, the lookup information may be cached in a memory location associated with one of multiple channels of a memory device. The lookup information may include a subset of the BFEA lookup information contained in a shared memory, thereby including reduced table entries that must be searched for a given read command in order to determine a threshold offset value associated with host data to be read. As a result, lookup times associated with a BFEA scheme may be reduced, leading to reduced power, computing, and other resource consumption, and overall quicker and more efficient BFEA schemes.

FIG. 1 is a diagram illustrating an example system 100 capable of caching lookup tables for BFEA schemes. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device or apparatus configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMNIC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an eMMC interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the memory device 120 and/or the controller 130 may be configured to determine a subset of one or more BFEA lookup tables associated with a first memory location of the memory device, wherein the one or more BFEA lookup tables are stored in a second memory location of the memory device that is different from the first memory location; cache the subset of the one or more BFEA lookup tables in the first memory location; receive a read command associated with host data associated with the first memory location, wherein the host data is associated with a block family; determine, based on the block family and the subset of the one or more BFEA tables cached in the first memory location, a threshold voltage offset associated with the host data; compute a modified threshold voltage by applying the threshold voltage offset to a base read level voltage associated with the host data; and read, using the modified threshold voltage, the host data from the first memory location.

In some implementations, the memory device 120 and/or the controller 130 may be configured to receive a write command associated with host data; write the host data to the first memory location; associate the host data with a block family based on at least one of a time window during which the host data was written to the first memory location or a temperature window at which the host data was written to the first memory location; store, in one or more BFEA lookup tables associated with the second memory location, information associating the host data with the block family and associating a threshold voltage offset with the block family based on the at least one of the time window during which the host data was written to the first memory location or the temperature window at which the host data was written to the first memory location, wherein the one or more BFEA lookup tables are associated with multiple block families; and cache a subset of the one or more BFEA lookup tables associated with the block family in the first memory location.

In some implementations, the memory device 120 and/or the controller 130 may be configured to receive, a write command associated with host data; write the host data to a first memory location associated with the memory device; associate the host data with a block family based on at least one of a time window during which the host data was written to the first memory location or a temperature window at which the host data was written to the first memory location; store, in one or more BFEA lookup tables associated with a second memory location, information associating the host data with the block family and associating a threshold voltage offset with the block family based on the at least one of the time window during which the host data was written to the first memory location or the temperature window at which the host data was written to the first memory location, wherein the one or more BFEA lookup tables are associated with multiple block families; cache a subset of the one or more BFEA lookup tables associated with the block family in the first memory location; receive a read command associated with host data; determine, based on the block family and the subset of the one or more BFEA tables cached in the first memory location, the threshold voltage offset associated with the host data; compute a modified threshold voltage by applying the threshold voltage offset to a base read level voltage associated with the host data; and read, using the modified threshold voltage, the host data from the first memory location.

In some implementations, the memory device 120 and/or the controller 130 may be configured to determine a subset of one or more BFEA lookup tables associated with a first memory location of a memory device, wherein the one or more BFEA lookup tables are stored in a second memory location of the memory device that is different from the first memory location; cache the subset of the one or more BFEA lookup tables in the first memory location; receive a read command associated with host data associated with first memory location, wherein the host data is associated with a block family; determine, based on the block family and the subset of the one or more BFEA tables cached in the first memory location, a threshold voltage offset associated with the host data; compute a modified threshold voltage by applying the threshold voltage offset to a base read level voltage associated with the host data; and read, using the modified threshold voltage, the host data from the first memory location.

As indicated above, FIG. 1 is provided as an example. Other examples may differ from what is described with regard to FIG. 1.

Figure 2:
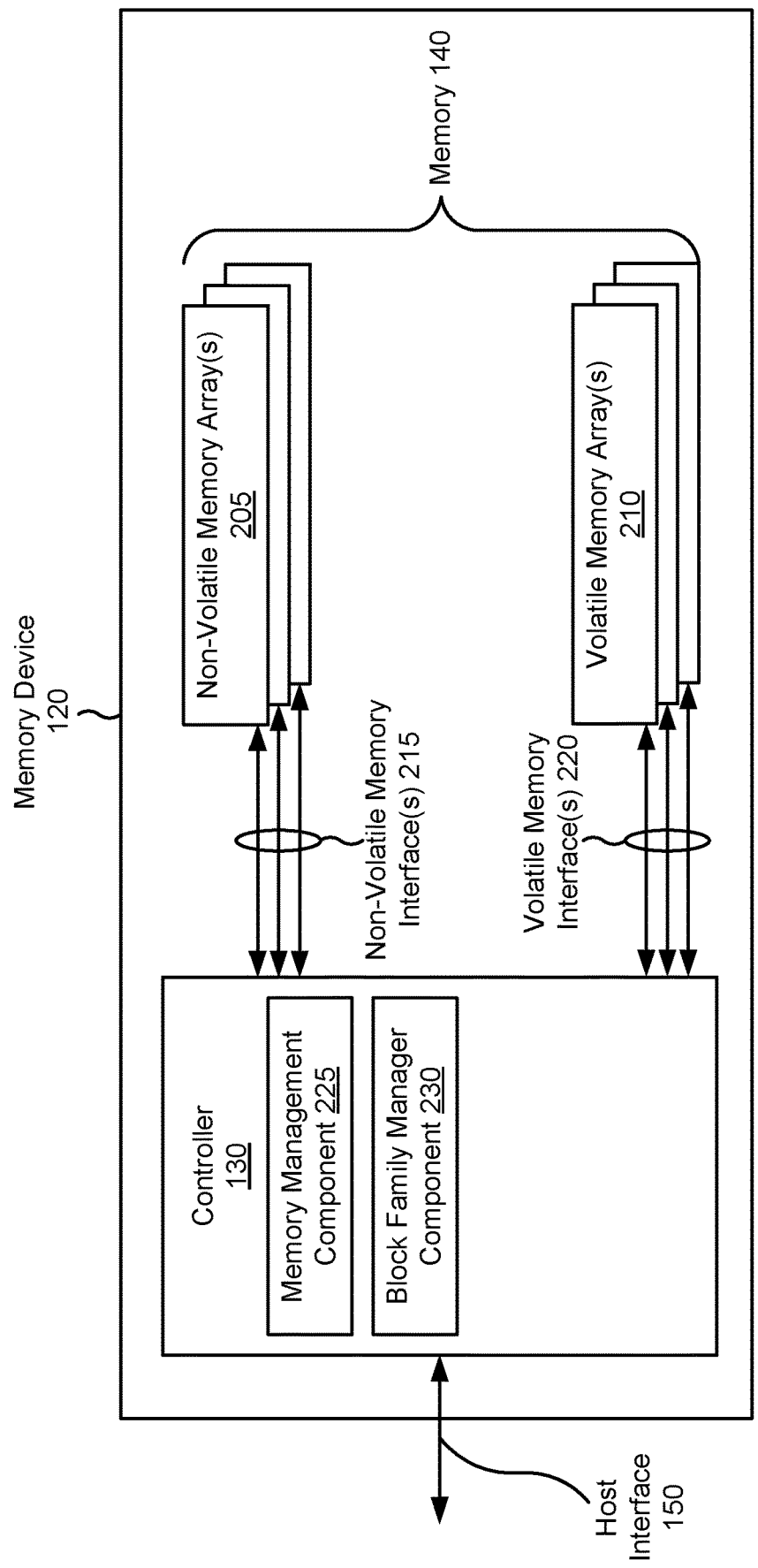
FIG. 2 is a diagram of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 205, such as one or more NAND memory arrays and/or one or more NOR memory arrays. Additionally, or alternatively, the memory 140 may include one or more volatile memory arrays 210, such as one or more SRAM arrays and/or one or more DRAM arrays. The controller 130 may transmit signals to and receive signals from a non-volatile memory array 205 using a non-volatile memory interface 215. The controller 130 may transmit signals to and receive signals from a volatile memory array 210 using a volatile memory interface 220.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 225, and/or a block family manager component 230. In some implementations, one or more of these components are implemented as one or more instructions (e.g., firmware) executed by the controller 130. Alternatively, one or more of these components may be implemented as dedicated integrated circuits distinct from the controller 130.

The memory management component 225 may be configured to manage performance of the memory device 120. For example, the memory management component 225 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 225, such as information regarding memory block age, memory block erase count, and/or error information associated with a memory partition (e.g., a memory cell, a row of memory, a block of memory, or the like).

The block family manager component 230 may be configured to implement block family-based error avoidance strategies (e.g., BFEA schemes) in accordance with implementations of the disclosure. In some implementations, the controller 130 includes at least a portion of the block family manager component 230. For example, as described above in connection with FIG. 1, in some implementations the controller 130 may include one or more high-level controllers and/or one or more low-level controllers. Accordingly, the one or more high-level controllers may include at least a portion of the block family manager component 230, and/or the one or more low-level controllers may include at least a portion of the block family manager component 230. In some implementations, the block family manager component 230 may manage block families associated with the memory devices 120, as described in more detail below.

One or more devices or components shown in FIG. 2 may be configured to perform operations described elsewhere herein, such as one or more operations and/or methods described in connection with FIGS. 3-10. For example, the controller 130, the memory management component 225, and/or the block family manager component 230 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
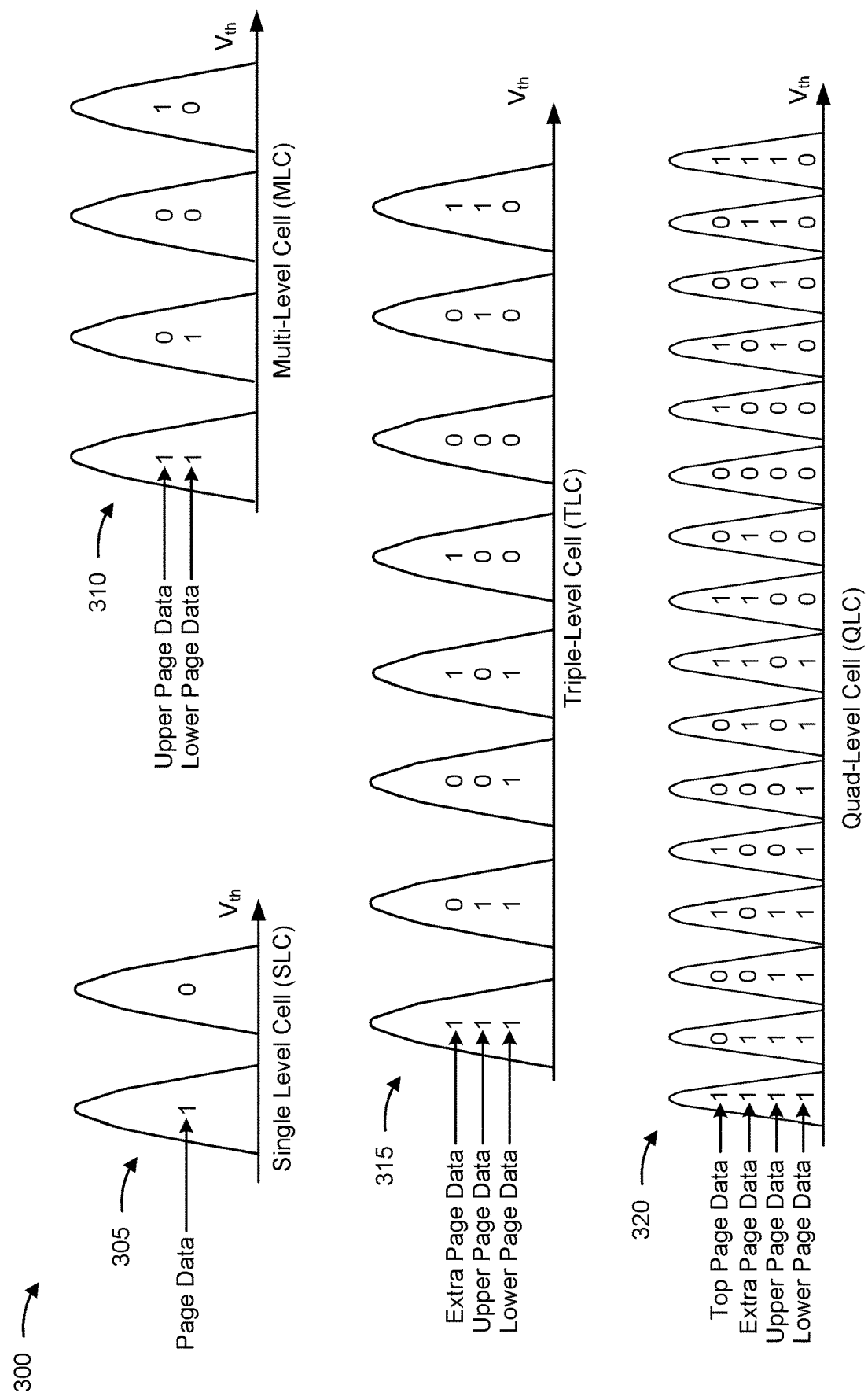
FIG. 3 is a diagram illustrating an example of single-level cell, multi-level cell, triple-level cell, and quad-level cell non-volatile memory.

FIG. 3 is a diagram illustrating an example 300 of single-level cell (SLC), multi-level cell (MLC), triple-level cell (TLC), and quad-level cell (QLC) non-volatile memory. One or more of these memory types may be used by a memory device described herein.

In some cases, a non-volatile memory device, such as a NAND device, may store bits of data by charging or not charging memory cells, which may be capable of retaining a charge (e.g., electrons) even when no voltage is applied to the cell. In some examples, multiple memory cells of a memory device 120 may be grouped as a page, which may refer to a logical unit of the memory device 120 used to store data. In some example memory devices 120 (e.g., NAND devices), multiple pages may be grouped to form blocks.

In some examples, a non-volatile, solid-state memory device (e.g., a flash memory device) may include a floating gate transistor configured to store electrical charge. The floating gate transistor may be isolated above and below by insulating oxide layers. The floating gate transistor may be charged by applying a high voltage to a control gate proximate to a first (or top) insulating layer (sometimes called a gate oxide), which causes electrons from a substrate proximate to a second (or bottom) insulating layer (sometimes called a tunnel oxide) to tunnel through the second insulating layer and to the floating gate, which is sometimes referred to as tunneling or Fowler-Nordheim tunneling. Conversely, the floating gate transistor may be erased by applying a high voltage to the substrate, which causes electrons from the floating gate transistor to tunnel through the second insulating layer and to the substrate. A lack of charge in the floating gate transistor, a presence of a charge in the floating gate transistor, and/or a level of the charge in the floating gate transistor indicates a data state stored by the memory cell or floating gate transistor.

In some other examples, a non-volatile, solid-state memory device (e.g., a flash memory device) may include a charge trap transistor configured to store electrical charge. In a charge trap type memory device, data is programmed or erased by providing or removing charges in or from a charge trap layer (e.g., a silicon-nitride (SiN) storage layer) through tunneling or injecting of electrons into the charge trap layer in a memory cell. The charge trap layer may be a dielectric material that can trap charges, thereby permitting the storage layer to be shared and continuous among the memory cells. Because in some implementations a word line is formed in the memory device by replacing one or more SiN films originally stacked in the memory device during a manufacturing process, charge trap memory devices are often referred to as replacement gate (RG) memory devices.

A non-volatile memory cell, such as a NAND cell, may be categorized as an SLC, an MLC, a TLC, or a QLC, among other examples. As shown by reference number 305, an SLC stores a single binary bit per memory cell, and thus may store either binary 1 or binary 0. In an SLC, the stored bit is sometimes referred to as the page data of the memory cell. When writing to an SLC, the cell may be charged to a threshold voltage ($V_{th}$) falling within the distribution of the curve labeled with page data "1" when the memory cell is to store binary 1 (or else may include no charge when the memory cell is to store binary 1), and may be charged to a threshold voltage falling within the distribution of the curve labeled with page data "0" when the memory cell is to store binary 0.

Unlike an SLC, which only stores a single bit, an MLC, a TLC, and a QLC may store multiple bits per memory cell. More particularly, as shown by reference number 310, an MLC stores two binary bits per memory cell, and thus is capable of storing binary 11, binary 01, binary 00, or binary 10 according to a level of a charge stored in the MLC. In an MLC, a first stored bit is sometimes referred to as the cell's upper page data, and the second stored bit is sometimes referred to as the cell's lower page data. When writing to an MLC, the cell may be charged to a threshold voltage falling within the distribution of the curve labeled with page data "11" when the memory cell is to store binary 11, the cell may be charged to a threshold voltage falling within the distribution of the curve labeled with page data "01" when the memory cell is to store binary a 01, the cell may be charged to a threshold voltage falling within the distribution of the curve labeled with page data "00" when the memory cell is to store binary 00, and the cell may be charged to a threshold voltage falling within the distribution of the curve labeled with page data "10" when the memory cell is to store binary 10. In some implementations, an MLC stores binary 11 when the MLC's charge is approximately 25% full, the MLC stores binary 01 when the MLC's charge is approximately 50% full, the MLC stores binary 00 when the MLC's charge is approximately 75%, and the MLC stores binary 10 when the MLC's charge is approximately 100% full. In some cases, "MLC" may alternatively be used to refer to any memory cell that stores two or more bits of data. Thus, "MLC' may refer to MLCs as described above, in addition to TLCs, QLCs, and higher level cells including cells capable of 4.5 bits of data per cell, penta-level cells (PLCs) capable of storing five bits of data per cell, or the like.

In a similar manner, and as shown by reference number 315, a TLC stores three binary bits per memory cell, and thus a TLC is capable of storing binary 111, binary 011, binary 001, binary 101, binary 100, binary 000, binary 010, or binary 110. For a TLC, the first, second, and third stored bits are sometimes referred to as the cell's "extra page data," the cell's "upper page data," and the cell's "lower page data," respectively. Moreover, as shown by reference number 320, a QLC stores four binary bits per memory cell, and thus is capable of storing binary 1111, binary 0111, binary 0011, binary 1011, binary 1001, binary 0001, binary 0101, binary 1101, binary 1100, binary 0100, binary 0000, binary 1000, binary 1010, binary 0010, binary 0110, or binary 1110. For a QLC, the first, second, third, and fourth bits are sometimes referred to as the cell's "top page data," the cell's "extra page data," the cell's "upper page data," and the cell's "lower page data," respectively. More broadly, for an n-bit memory cell, the threshold voltage of the cell may be programmed to $2^n$ separate states, with each state corresponding to a non-overlapping threshold distribution, as shown for the various memory cells in FIG. 3.

To read the data stored in a memory cell, such as an SLC, an MLC, a TLC, a QLC, or another type of memory cell, a memory device (or a component thereof) may sense a voltage associated with the stored charge on the memory cell (e.g., may sense a $V_{th}$ associated with the cell) and determine a corresponding binary number associated with that voltage.

As indicated above, FIG. 3 is provided as an example. Other examples may differ from what is described with regard to FIG. 3.

Figure 4:
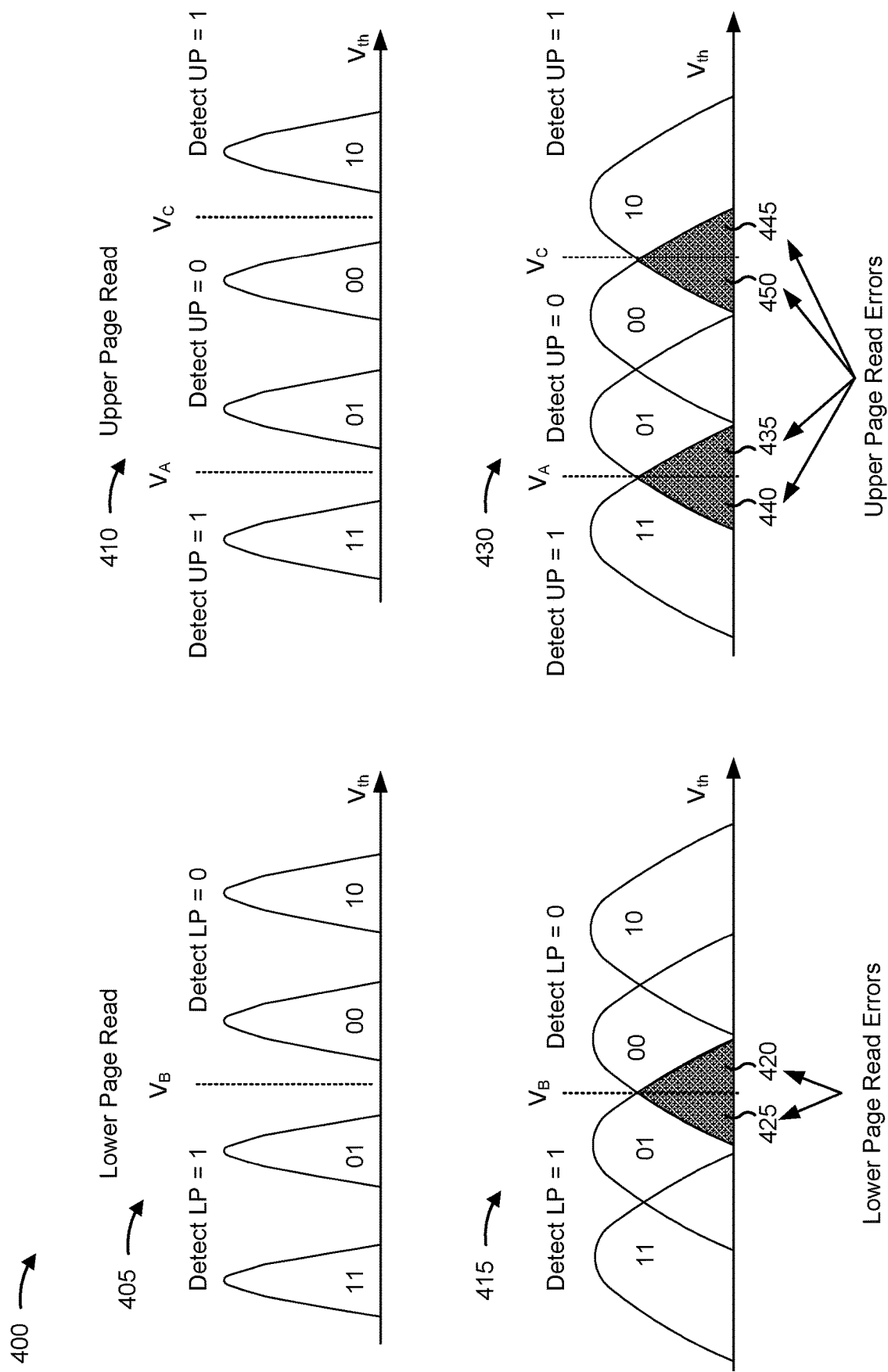
FIG. 4 is a diagram illustrating an example of read errors that may occur in a non-volatile memory device.

FIG. 4 is a diagram illustrating an example 400 of read errors that may occur in a non-volatile memory device. Although the read errors described in connection with FIG. 4 are described in the context of an MLC, the described concepts also apply to other types of memory cells, such as SLCs, TLCs, QLCs, and other types of memory cells.

A described above in connection with FIG. 3, some memory devices may be capable of storing multiple bits per memory cell. For example, an MLC non-volatile memory device (e.g., an MLC flash device) may be capable of storing two bits of information per memory cell in one of four states (e.g., may store binary 11, binary 01, binary 00, or binary 10 depending on a charge applied to the memory cell). To read the data of a memory cell, such as the MLC shown in FIG. 4, the memory device (or a component thereof) may apply a read reference voltage to the cell in an effort to induce current in the memory cell, and the memory device (or a component thereof) may determine a corresponding bit string associated with a voltage that induced (or else did not induce) current. Put another way, the memory device may apply various read reference voltages to sense the threshold voltage ($V_{th}$) associated with the data stored in the cell.

More particularly, for an MLC, the memory device may perform a lower page (also shown as LP) read and an upper page (also shown as UP) read. As shown by reference number 405, for a lower page read, the memory device may apply to a read reference voltage, shown as $V_B$. $V_B$ may represent a voltage between threshold voltage distributions associated with the first two states (e.g., threshold voltage distributions associated with binary 11 and 01) and threshold voltage distributions associated with the second two states (e.g., threshold voltage distributions associated with binary 00 and 10). If current flows when $V_B$ is applied to the memory cell, then the threshold voltage may be considered to be less than $V_B$, thus corresponding to one of binary 11 or binary 01 (meaning that the lower page data represents a "1"). If current does not flow when $V_B$ is applied to the memory cell, then the threshold voltage may be considered to be more than $V_B$, thus corresponding to one of binary 00 or binary 10 (meaning that the lower page data represents a "0").

As shown by reference number 410, an upper page read may be performed in a similar manner. More particularly, when the detected lower page data is a "1", a read reference voltage of $V_A$ may be applied to the memory cell to thereafter determine the upper page data. $V_A$ may represent a voltage between a threshold voltage distribution associated with the first state (e.g., a threshold voltage distribution associated with binary 11) and a threshold voltage distribution associated with the second state (e.g., a threshold voltage distribution associated with binary 01). If current flows when $V_A$ is applied to the memory cell, then the threshold voltage may be considered to be less than $V_A$, thus corresponding to binary 11 (meaning that the upper page data represents a "1"). If current does not flow when $V_A$ is applied to the memory cell, then the threshold voltage may be considered to be more than $V_A$ but less than $V_B$ (as determined during the lower page read), thus corresponding to binary 01 (meaning that the upper page data represents a "0").

Similarly, when the detected lower page data is a "0," a read reference voltage of $V_C$ may be applied to the memory cell to thereafter determine the upper page data. $V_C$ may represent a voltage between a threshold voltage distribution associated with the third state (e.g., a threshold voltage distribution associated with binary 00) and a threshold voltage distribution associated with the fourth state (e.g., a threshold voltage distribution associated with binary 10). If current flows when $V_C$ is applied to the memory cell, then the threshold voltage may be considered to be less than $V_C$ but more than $V_B$ (as determined during the lower page read), thus corresponding to binary 00 (meaning that the upper page data represents a "0"). If current does not flow when $V_C$ is applied to the memory cell, then the threshold voltage may be considered to be more than $V_C$, thus corresponding to binary 10 (meaning that the upper page data represents a "1").

In some cases, the threshold voltage distributions shown in FIG. 4 may be broadened due to noise, SCL, or the like, which may lead to read errors at the memory device. Noise in the memory cell may be caused by various sources, such as program-erase (P/E) cycling stress, charge leakage over time, read disturbances (e.g., disturbances caused by the application of a high voltage to a memory cell of a page not being read to deselect the cell while other cells on the page are being read), programming errors, cell-to-cell interference (such as unintentional electrical disturbance and/or interference of a memory cell when neighboring cells are read, written, or erased), or the like. For example, in some cases, a cell's charge level may dissipate over time, sometimes referred to as a temporal voltage shift and/or an SCL, which is described in more detail below in connection with FIG. 5. As shown in FIG. 4, broadened voltage threshold distributions may lead to read errors, such as lower page read errors and/or upper page read errors.

First, as shown by reference number 415, a lower page read error may be caused by the broadening of voltage distributions that are near $V_B$ and/or that overlap with $V_B$. In the example shown in FIG. 4, the threshold voltage distributions associated with binary 01 and binary 00 have broadened to overlap with the read reference voltage $V_B$. This may result in a lower page read error because a cell programmed with binary 01 may act in a similar manner to a cell programmed with binary 00 (e.g., in response to an applied voltage). More particularly, if $V_B$ is applied to a memory cell that stores binary 01 but that is associated with a threshold voltage in the area labeled with reference number 420, no current would flow, erroneously indicating that the lower page data represents a "0" rather than a "1". On the other hand, if $V_B$ is applied to a memory cell that stores binary 00 but that is associated with a threshold voltage in the area labeled with reference number 425, current would flow, erroneously indicating that the lower page data represents a "1" rather than a "0".

Similarly, as shown by reference number 430, when performing an upper page read, an upper page read error may be caused by the broadening of voltage distributions that are near $V_A$ and/or $V_C$ and/or that overlap with $V_A$ and/or $V_C$. For example, memory cells storing binary 11 and associated with a threshold voltage in the area labeled by 435 may be erroneously read as storing upper page data of "0", memory cells storing binary 01 and associated with a threshold voltage in the area labeled by 440 may be erroneously read as storming upper page data of "1", memory cells storing binary 00 and associated with a threshold voltage in the area labeled by 445 may be erroneously read as storing upper page data of "1", and memory cells storing binary 10 and associated with a threshold voltage in the area labeled by 450 may be erroneously read as storing upper page data of "0".

In some cases, a memory device may attempt to adjust one or more read reference voltages in response to one or more of the read errors described above (e.g., in response to a cell storing one logical value or binary number being misread as storing a different logical value or binary number). In some instances, this may be referred to as a read retry or a read recovery process. In a read recovery process, one or more read reference voltages (such as $V_A$, $V_B$, or $V_C$ described in connection with the MLC) may be dynamically adjusted to track changes in threshold voltage distributions. More particularly, once a read process fails on a particular page of a memory, the memory device (and, more particularly, the controller and/or a read recovery component thereof) may attempt to recover the page using various read recovery steps, which use shifts in voltages from base read reference voltages. Put another way, the memory device may retry the read of a cell with an adjusted read reference voltage such that read errors are decreased or eliminated.

Returning to the example shown in FIG. 4, if a lower page error resulted in a cell storing binary 00 being read as binary 01, the read reference voltage ($V_B$) may be decreased (e.g., shifted to the left in the diagram shown by reference number 415) in an effort to eliminate the lower page read error. Conversely, if a lower page error resulted in a cell storing binary 01 being read as binary 00, the read reference voltage ($V_B$) may be increased (e.g., shifted to the right in the diagram shown by reference number 415). Similarly, the read reference voltages $V_A$ and $V_C$ may be shifted left or right (e.g., decreased or increased) in an effort to reduce or eliminate upper page read errors.

In some cases, a memory device may adjust one or more read reference voltages according to a BFEA scheme. In a BFEA scheme, the memory device may determine a voltage offset from a block family lookup table or a similar table, and apply the offset to a read reference voltage (e.g., $V_A$, $V_B$, $V_C$, or a similar read reference voltage) when reading data from a cell. Details of a BFEA scheme are described in more detail below in connection with FIGS. 5-10.

As indicated above, FIG. 4 is provided as an example. Other examples may differ from what is described with regard to FIG. 4.

Figure 5:
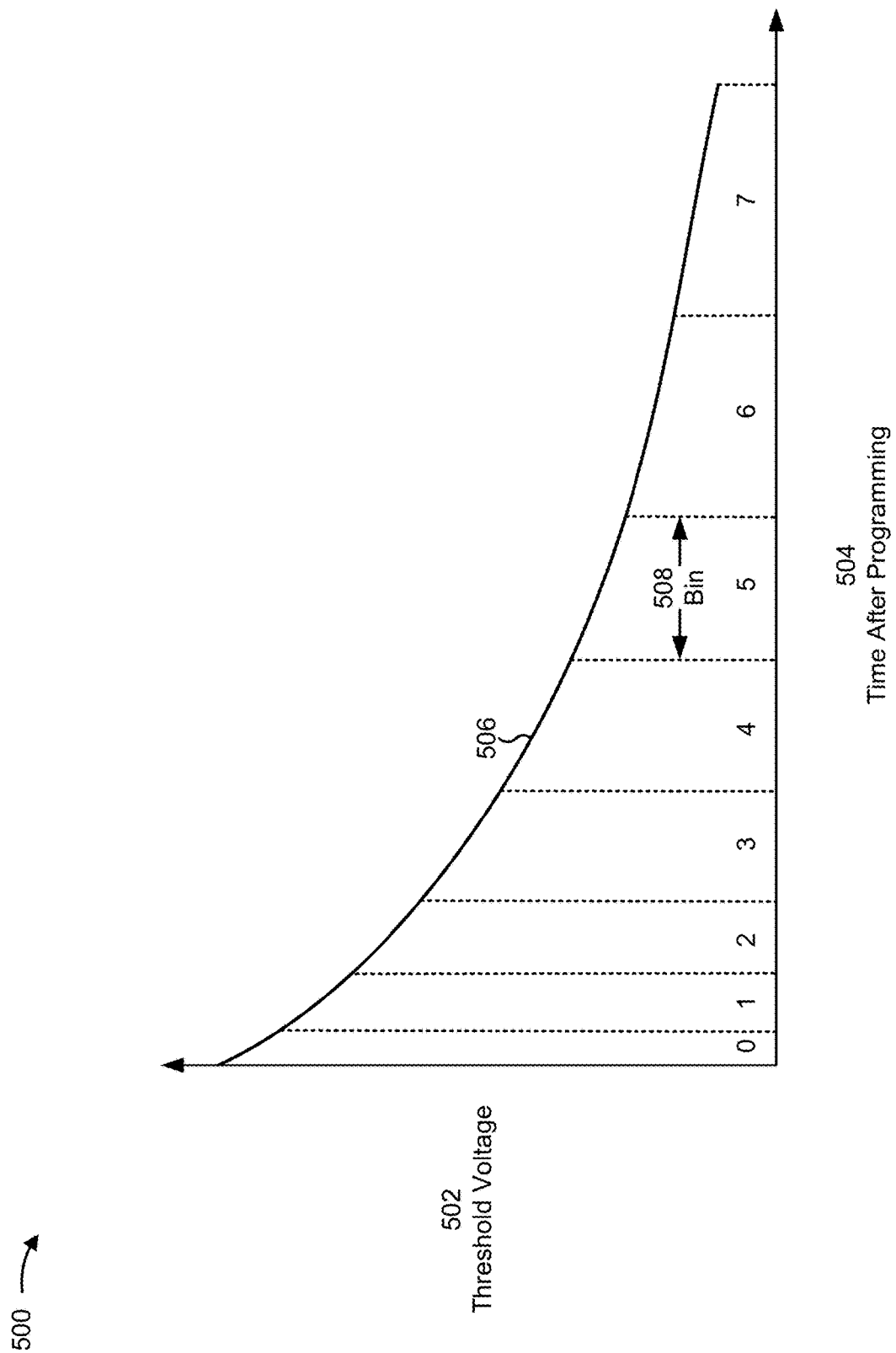
FIG. 5 depicts an example graph illustrating a dependency of a threshold voltage on a time after programming (e.g., a period of time that has elapsed since the block has been programmed).

FIG. 5 depicts an example graph 500 illustrating a dependency of a threshold voltage 502 on a time after programming 504 (e.g., a period of time that has elapsed since the block has been programmed).

In some cases, such as for RG memory devices or similar devices, voltage distributions in a memory cell may change over time due to SCL, which results in drifting values of the threshold voltage levels. In some examples, the temporal voltage shift may be selectively tracked for programmed blocks grouped by block families, and appropriate voltage offsets, which may be based on block affiliation with a certain block family, may be applied to base read levels in order to perform read operations.

More particularly, as schematically illustrated by a voltage curve 506 in FIG. 5, memory cells of RG memory devices or other similar devices may experience a loss of charge over time after the memory cell is programmed. While all voltage threshold distributions associated with a particular type of memory cell may lose charge over time, in some cases lower voltage threshold distributions may lose charge at a reduced rate as compared to higher voltage threshold distributions. For example, with respect to TLCs, each of the seven voltage threshold distributions (e.g., the voltage threshold distributions corresponding to binary 011, binary 001, binary 101, binary 100, binary 000, binary 010, or binary 110) may shift with time, and each voltage threshold distribution may shift at a different rate.

In some cases, a memory device 120 may implement a BFEA system in order to compensate for SCL and other voltage shifts associated with a memory cell over time. In some examples, a memory device 120 may track data written in the same temperature and time domain for purposes of mitigating SLC or the like. For example, data written in the same temperature and time domain may be referred to as a block family, which may be tracked together since the data may exhibit the same SCL properties across time and temperature. Each block family may include one or more full blocks or partial blocks (e.g., partitions) that have been programmed within a specified time window and a specified temperature window. Because the time elapsed after programming and temperature may be factors affecting the temporal voltage shift, all blocks and/or partitions within a single block family may be presumed to exhibit similar distributions of threshold voltages in memory cells, and thus may be associated with the same voltage offsets for read operations. Block families may be created asynchronously with respect to block programming events. For example, the memory device 120 may create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

In some examples, a BFEA system may be associated with eight bins, such as the bins 508 shown in FIG. 5 indexed as bin 0 to bin 7. Each bin may be associated with a corresponding optimal voltage threshold offset value to be applied to a read reference voltage when reading data from a memory cell. For example, a controller 130 may be provided with an indication of a bin 508 corresponding to a block family for data being read in order to utilize a corresponding threshold offset value when performing a read command, or the like. In some examples, the indication of the of the bin 508 corresponding to the block family for the data being read may be associated with an auto read calibration (ARC) process associated with the memory device. For example, the indication of the of the bin 508 corresponding to the block family for the data being read may be associated with an address cycle read retry (ACRR) value associated with a seventh address cycle in a read command sequence.

A newly created block family may be associated with bin 0. Then, the controller 130 may periodically perform a calibration process in order to associate each die of each block family with one of the predefined threshold voltage offset bins (bins 0-7 in the illustrative example of FIG. 5), which is in turn associated with the voltage offset to be applied for read operations. The associations of blocks with block families and block families and dies with threshold voltage offset bins may be stored in respective metadata tables maintained by the controller 130, as described in more detail below in connection with FIG. 6.

Figure 6:
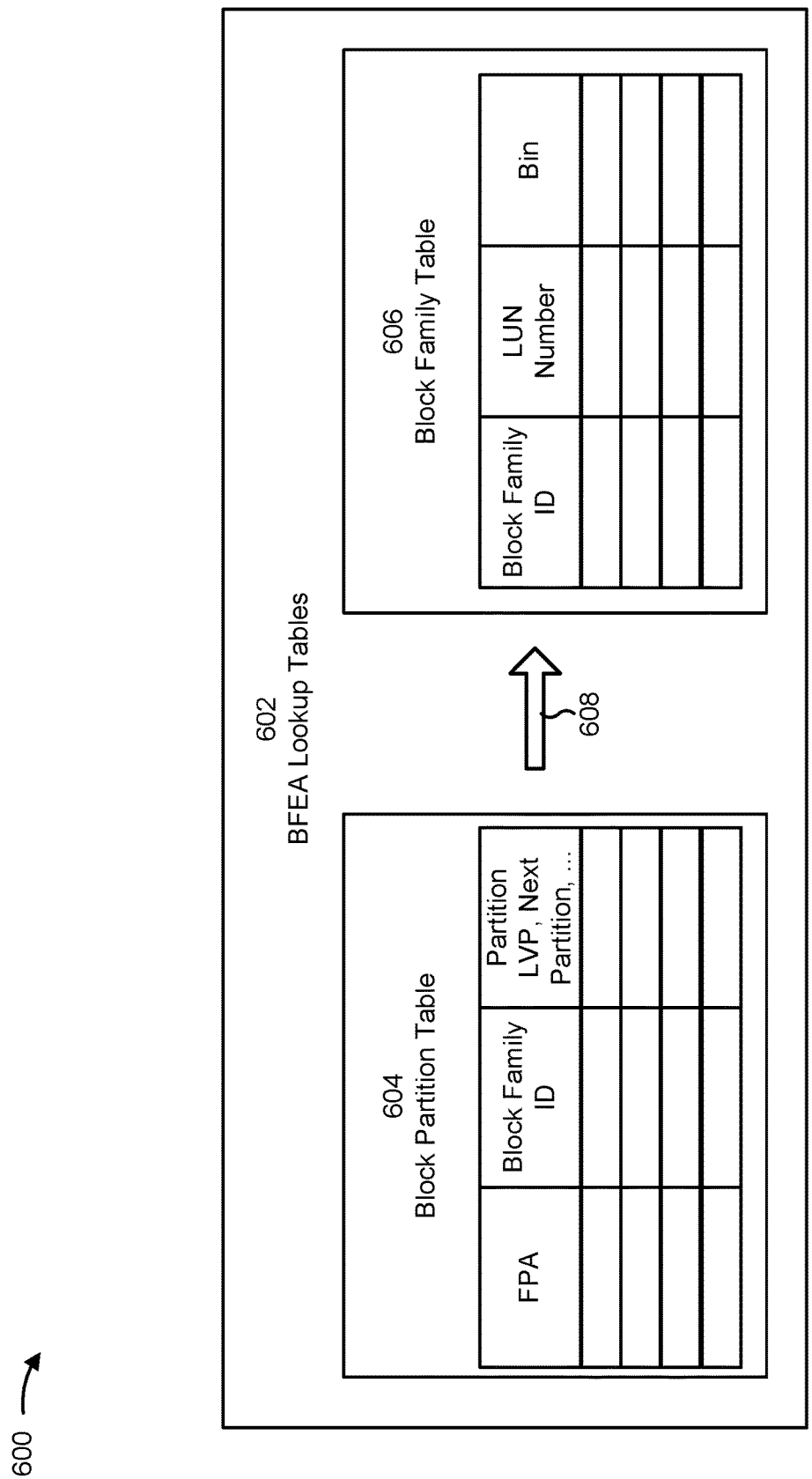
FIG. 6 schematically depicts an example of a set of BFEA lookup tables.

FIG. 6 schematically depicts an example 600 of a set of BFEA lookup tables 602. In some examples, the set of BFEA lookup tables 602 may be stored in memory 140, such as one or more non-volatile memory arrays 205. Moreover, in some examples, the set of BFEA lookup tables 602 may be stored in, or otherwise associated with, a memory location corresponding to a high-level controller of the memory device 120. In some examples, the set of BFEA lookup tables 602 may be stored in a shared memory location accessible by multiple controllers (e.g., high-level controllers, low-level controllers, among other examples) of the memory device 120.

In some examples, the set of BFEA lookup tables 602 may include a block partition table 604 and/or a block family table 606, among other examples. In some cases, information contained in one lookup table associated with the set of BFEA lookup tables 602 may be used to locate information in another lookup table associated with the set of BFEA lookup tables 602. For example, in some examples, information determined from the block partition table 604 may be used to locate information contained within the block family table 606, as schematically indicated by arrow 608. More particularly, based on a Flash Physical Address (FPA) associated with data, an LBA associated with data, a namespace associated with data, a location identifier associated with data, or similar address associated with data, a controller 130 may determine a block family identifier and/or similar information from the block partition table 604, which may in turn be used to determine a bin number and/or threshold voltage offset value or similar information from the block family table 606.

More particularly, when a controller 130 of a memory device 120 receives a read command from a host device 110 (such as via host interface 150) associated with host data to be read from the memory device 120, the read command may include an FPA, an LBA, a namespace, a location identifier, or similar address associated with the host data, which may indicate a location within the memory device 120 where the host data is stored. Prior to reading the host data (which, as described above, may have suffered voltage threshold shifts due to SCL or the like), the controller 130 may determine an appropriate bin value of the BFEA system associated with the read. To do so, the controller 130 may determine a block family identifier associated with the indicated FPA, LBA, namespace, location identifier, or the like, via the block partition table 604, or via a similar table. The block partition table 604 may be indexed by block number, with each block number associated with four block partitions. Each entry of the block partition table 604 may include a bit string or the like indicating a block family identifier for the corresponding block partition and block number, among other information. In some examples, each entry may be 32-bits, and may indicate a block family identifier associated with the block partition (which may be 6-bits, used to indicate one of 64 block families), a partition logical virtual page (LVP) number (which may be 12-bits), and/or an indication of a next block partition (which may be 14-bits, including 12-bits to indicate a next block stripe identifier, and/or 2-bits to indicate a partition identifier within the block stripe identifier). By looking up the FPA, LBA, namespace, or similar identifier in the block partition table 604, the controller 130 may determine the block family identifier associated with host data to be read.

In some examples, a controller 130 may use the block family identifier and/or other information, such as a LUN number associated with the host data, to determine a bin number associated with the read operation from the block family table 606, or a similar table. More particularly, the block family table 606 may associate a corresponding bin number with each block family identifier and/or additional information, such as a LUN number or the like. In some cases, the block family table 606 may be indexed by block family identifiers and/or LUN numbers obtained from the block partition table 604. By looking up the block family identifier, LUN number, and/or other information associated with the host data in the block family table 606, the controller may determine the bin number corresponding to the read operation, and thus apply an appropriate voltage threshold offset to a read operation, as is described in more detail in connection with FIGS. 7A-7H.

In some examples, the controller 130 (and, more particularly, the memory management component 225 and/or the block family manager component 230 thereof) may be configured to perform one or more BFEA management tasks associated with storing data in the one or more BFEA lookup tables 602, reading data from the one or more BFEA lookup tables 602, updating data in the one or more BFEA lookup tables 602, or the like. Put another, in some cases, BFEA management may include three primary functions: write (e.g., generation of the block family), read (e.g., lookup and application of the correct bin number), and scan (e.g., management of the block families as they age).

During host data writes, the block family manager component 230 may assign a block family identifier to any block and/or page combination that is being written at given time and temperature. During a beginning of the period, a unique block family identifier may be chosen and stored in the block partition table 604. The block family identifier may be tracked until the time period is expired and a new block family identifier is chosen for any subsequent writes. The block partition table 604 may be updated with the block family identifiers for the blocks and pages that have been written during that period. All of blocks and partitions that are identified by the same block family identifier may be linked together in the block partition table 604.

During host data reads, the block family manager component 230 may obtain the correct bin number by looking up block family identifier in the block partition table 604 by translating an FPA or similar location identifier into block and page addresses. The block family manager component 230 may use the block family identifier, LUN number, and/or other information to look up the bin number associated with the host data read in the block family table 606. In some examples, the bin number associated with the host data read may be associated with a seventh address cycle (sometimes referred to as Addr7 cycle) in a read command sequence as an ACRR byte.

As host data written during a given time and temperature domain ages, the SCL levels (e.g., bin numbers), may need to be adjusted. Accordingly, in some examples, the block family manager component 230 may perform a scan operation to sample data on specific block family LUNs and pages. The block family manager component 230 may update the block family table 606 when a new bin number is appropriate for a given block family. Also, as time passes, multiple block families may begin behaving in a same manner and may be combined for the purposes of further tracking. In such examples, the block family manager component 230 may update the block partition table 604 when combining multiple block families into a single block family.

In some cases, performing one or more of the above host data write, host data read, and/or host data scan tasks may be very time consuming and may require high power and resource consumption. For example, the one or more BFEA lookup tables 602 may be relatively large and/or the one or more BFEA lookup tables 602 may be stored in a shared memory location associated with a high-level controller or processor. Thus, when a low-level controller or processor (e.g., a channel processor) needs to obtain a bin number for a read command, the low-level controller may need to perform multiple cycles to complete the lookup operations associated with obtaining a bin number associated with a certain read operation, leading to long processing times and high power and computing resource consumption. Accordingly, in some implementations, a portion of the one or more BFEA lookup tables 602 may be cached locally (e.g., in a memory location associated with a low-level controller, channel processor, or the like) in order to reduce processing times and resource consumption associated with performing a BFEA lookup procedure. Details of caching a portion of the one or more BFEA lookup tables 602 are described in more detail in connection with FIGS. 7A-7H, below.

FIGS. 7A-7H are diagrams of an example implementation 700 associated with caching lookup tables for block family error avoidance.

A shown in FIGS. 7A-7H, in some implementations, the memory device 120 (e.g., a NAND device) described in connection with FIG. 2 may be associated with multiple controllers, such as a high-level controller 702 and a low-level controller 704. In some implementations, the high-level controller 702 may be a central controller, sometimes referred to as an HS processor, an HS controller, and/or an HS CPU core. Additionally, or alternatively, in some implementations, the low-level controller 704 may be a channel controller (e.g., a controller associated with a subset of memory die associated with a particular channel), sometimes referred to as an EM processor or EM CPU. In some implementations, as shown in FIGS. 7A-7H, the memory device 120 may include multiple low-level controllers 704. For example, in some implementations, the memory device 120 may be associated with multiple (e.g., sixteen) channels, with each channel associated with a corresponding low-level controller 704. In some implementations, the memory device 120 may include multiple memory die, with each channel being associated with a subset of the multiple memory die. For example, in some implementations, the memory device may be associated with 128 memory die, and each channel (and thus each low-level controller 704) may be associated with eight memory die. In some implementations, the high-level controller 702 and/or the low-level controller 704 may correspond to the controller 130 described in connection with FIGS. 1-2. In that regard, the high-level controller 702 and/or the low-level controller 704 may be associated with the block family manager component 230, among other components described in connection with FIG. 2. In some implementations, the high-level controller 702 and the low-level controller 704 may be in communication with one another, such as via the non-volatile memory interface 215 or a similar interface.

In some implementations, the high-level controller 702 may be associated with a high-level controller (HLC) memory location 706. The HLC memory location 706 may be a shared memory location within the memory device 120 that may store information applicable to more than one channel and/or applicable to more than one low-level controller 704. For example, in some implementations, the HLC memory location 706 may store one or more BFEA lookup tables 708 (which, in some implementations, correspond to the one or more BFEA lookup tables 602 described above in connection with FIG. 6). Additionally, or alternatively, each low-level controller 704 may be associated with a low-level controller (LLC) memory location 710. The LLC memory location 710 may be a local memory location that may store information only applicable to the corresponding low-level controller 704. For example, in some implementations, the LLC memory location 710 may be associated with a single-cycle access memory coupled with the low-level controller 704. Moreover, in some implementations, the LLC memory location 710 may store cached lookup information 712, which may include a subset of information from the one or more BFEA lookup tables 708 that is applicable to the one or more die associated with the corresponding channel.

Figure 7A:
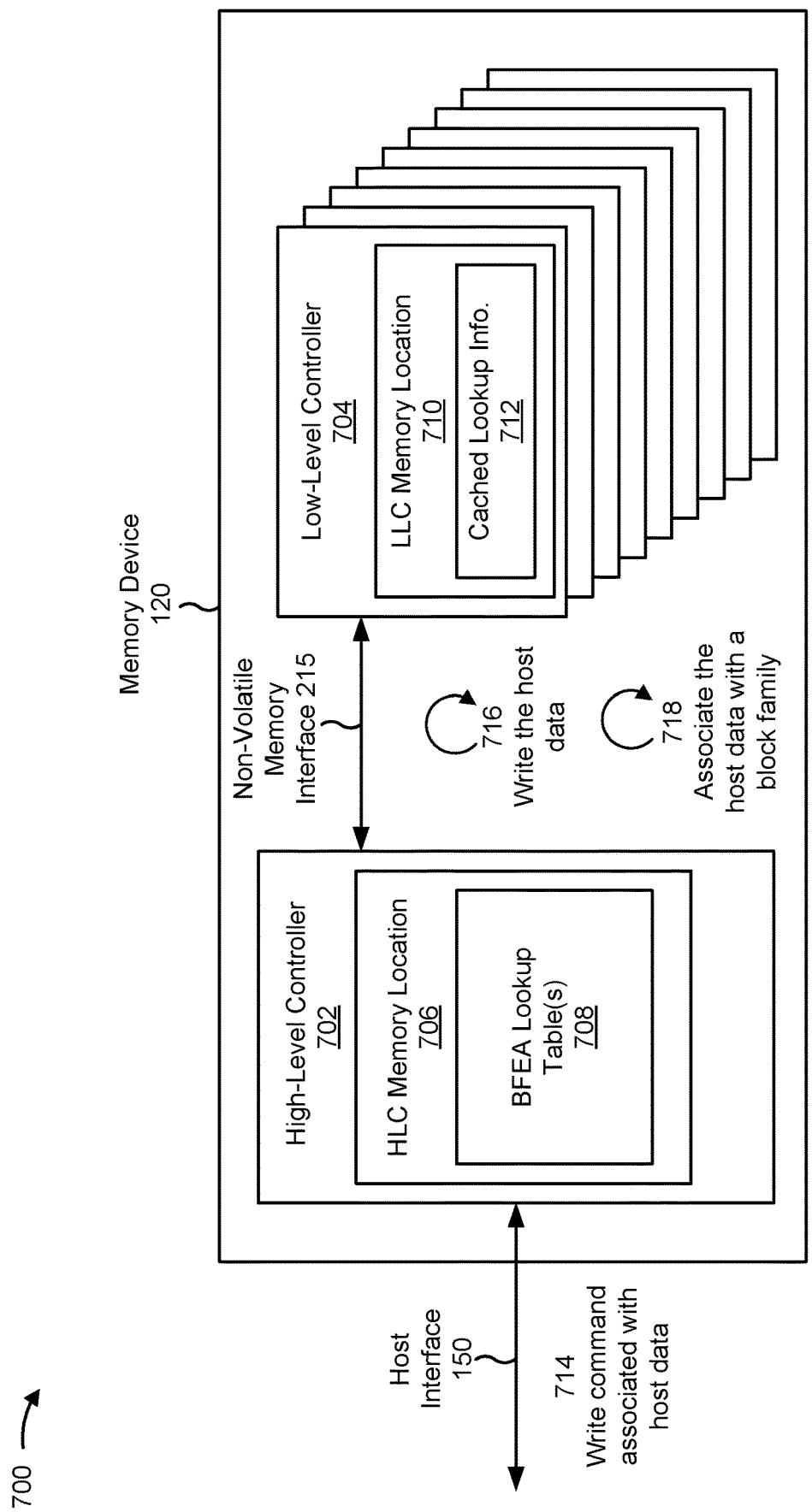
FIGS. 7A-7H are diagrams of an example implementation associated with caching lookup tables for block family error avoidance.
Figure 7B:
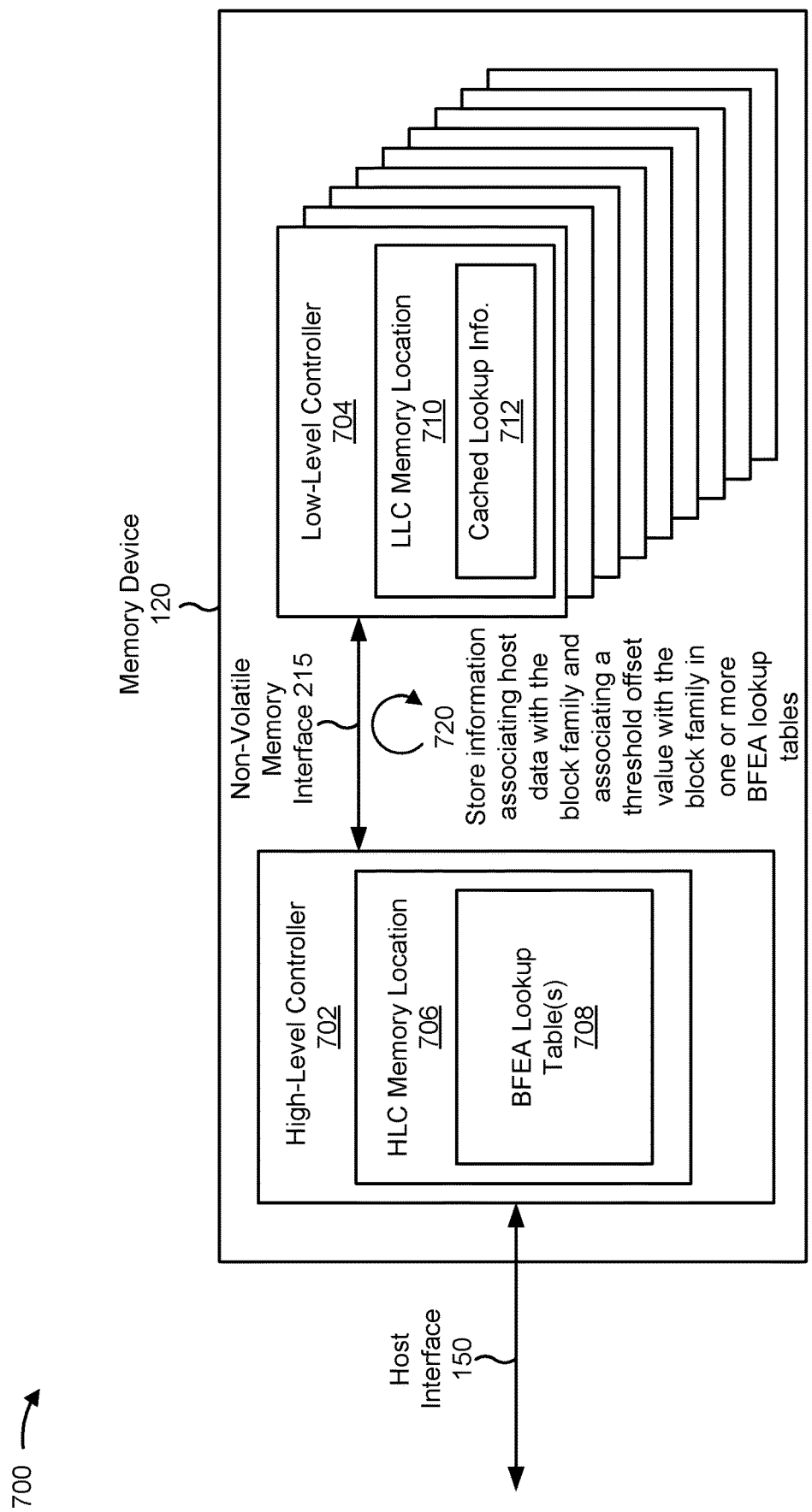

A shown in FIG. 7A, and as indicated by reference number 714, in some implementations the memory device 120 may receive a write command from a host device (not shown in FIG. 7A, but similar to the host device 110 described in connection with FIG. 1). For example, the memory device 120 may receive the write command from the host device via the host interface 150. As shown by reference number 716, the memory device 120 may write the host data to a memory location, such as a non-volatile memory location. In some implementations, the memory device 120 may write the host data to a memory location associated with a channel associated with the low-level controller 704 (sometimes referred to herein as a first memory location). For example, the memory device 120 may write the host data to the LLC memory location 710. Moreover, as indicated by reference number 718, the memory device 120 may associate the host data with a block family.

As described in detail in connection with FIGS. 5-6, in some implementations, the host data may be associated with a block family based on a time window during which the host data was written to the first memory location or a temperature window at which the host data was written to the first memory location. Moreover, as shown by reference number 720 in FIG. 7B, in some implementations, the memory device 120 may store information associating the host data with the block family. For example, the memory device 120 may store information associating the host data with the block family in the one or more BFEA lookup tables 708 stored in the HLC memory location 706 (sometimes referred to herein as a second memory location), such as in the block partition table 604 described above in connection with FIG. 6. In some implementations, the one or more BFEA lookup tables may include additional information, such as a threshold offset value (e.g., a bin number) associated with the block family. Accordingly, in some implementations, the memory device 120 may store information associating a threshold offset value with the block family in the one or more BFEA lookup tables 708, such as in the block family table 606 described above in connection with FIG. 6.

As described above in connection with FIG. 6, the one or more BFEA lookup tables 708 may include information associated with every block family and/or every die associated with the memory device 120, and thus the one or more BFEA lookup tables 708 may contain voluminous information that is time-consuming and resource-consuming to process. Accordingly, in some implementations, a relevant portion of the one or more BFEA lookup tables 708 may be cached in the first memory location (e.g., may be cached in a local LLC memory location 710 associated with the low-level controller 704), such as the cached lookup information 712, in order to provide quicker lookup times during a BFEA process, or the like.

Figure 7C:
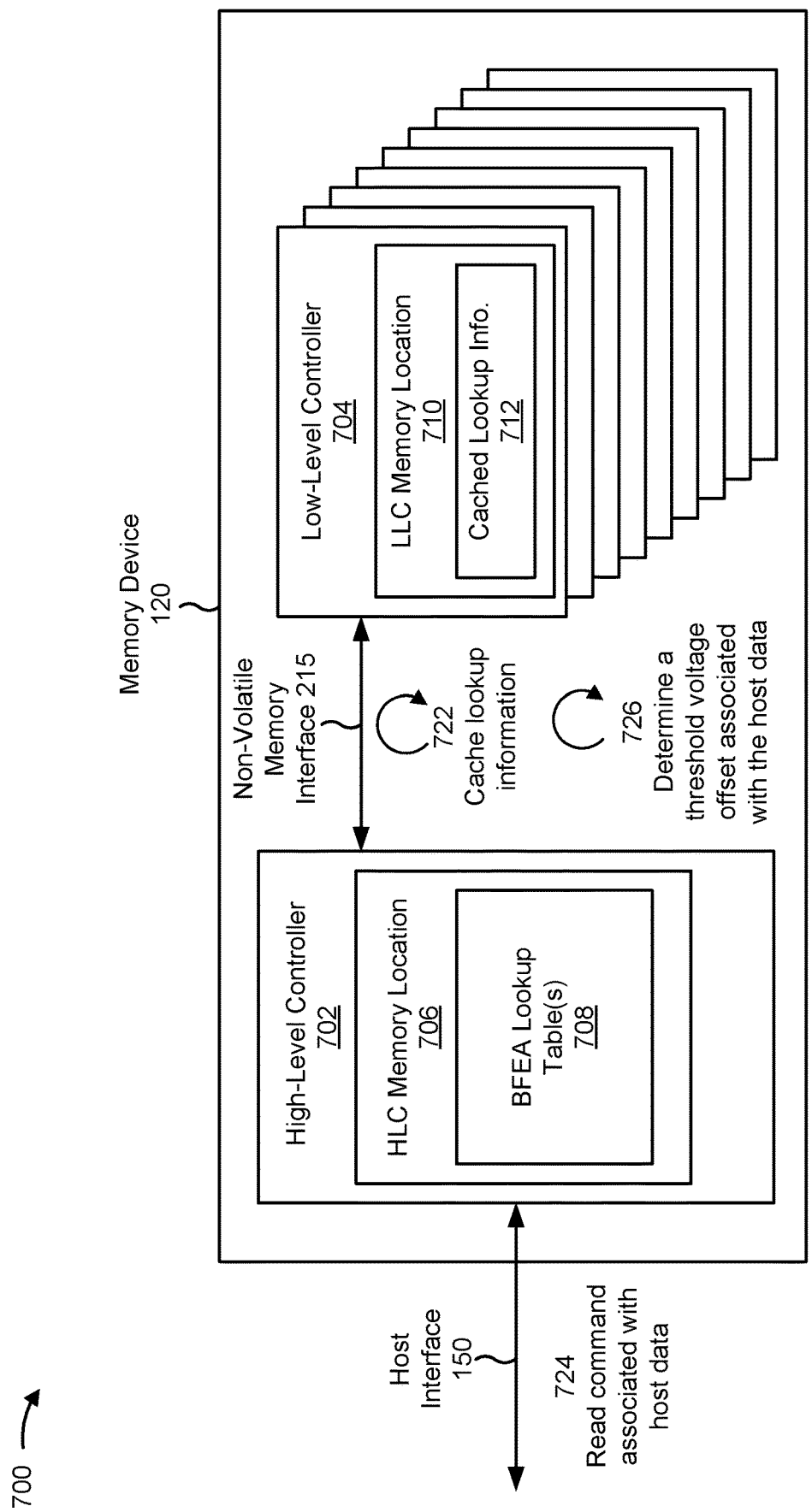

More particularly, as shown in FIG. 7C, and as indicated by reference number 722, the memory device may cache lookup information in the first memory location (e.g., the LLC memory location 710). More particularly, in some implementations, the memory device 120 may determine a subset of the one or more BFEA lookup tables 708 associated with the first memory location of the memory device (e.g., the memory device 120 may determine a subset of the one BFEA lookup tables 708 that is associated with the channel associated with the low-level controller 704). Accordingly, the memory device 120 may cache the subset of the one or more BFEA lookup tables in the first memory location (shown as cached lookup information 712 in FIG. 7C). In some implementations, the cached information may include BFEA information associated with the block family associated with the host data that was written to the first memory location. More particularly, the cached information may include BFEA information associated with a plurality of blocks that are associated with at least one of a time window during which the host data was written to the first memory location or a temperature window at which the host data was written to the first memory location. Moreover, as described above in connection with the one or more BFEA lookup tables 602, the one or more BFEA lookup tables 708 may include at least a block partition table (e.g., the block partition table 604) and a block family table (e.g., the block family table 606). In such examples, the subset of the one or more BFEA tables cached in the first memory location may include a first subset of the block partition table and a second subset of the block family table.

As shown by reference number 724, the memory device 120 may receive, from the host device (e.g., via the host interface 150) a read command associated with the host data associated with the first memory location (e.g., the host data stored in the channel associated with the low-level controller 704). As described above, the host data may be associated with a block family, and a subset of the BFEA lookup tables 708 applicable to the block family may be cached in the first memory location (e.g., the LLC memory location 710). In that regard, the low-level controller 704 may look up a threshold voltage offset value associated with the host data by referencing the cached lookup information 712 in the LLC memory location 710 rather than searching the voluminous one or more BFEA lookup tables 708 stored in the HLC memory location 706.

More particularly, as shown by reference number 726, the memory device 120 may determine, based on the block family and the subset of the one or more BFEA tables cached in the first memory location, a threshold voltage offset (e.g., a bin number) associated with the host data. In some implementations, determining the threshold voltage offset associated with the host data may include associating a block family identifier associated with the host data with the threshold voltage offset based on the subset of the one or more BFEA tables cached in the first memory location. As described above, the memory device 120 may determine the threshold voltage offset relatively quickly (e.g., as compared to searching the entirety of the one or more BFEA lookup tables 708) because the memory device 120 (and, more particularly, the low-level controller 704 thereof) needs only to search the subset of the BFEA lookup tables stored in local memory (e.g., single-cycle access memory, or the like). Accordingly, determining the threshold voltage offset (e.g., a bin number) associated with the host data may be performed quicker, and with less resource consumption, than previous BFEA processes.

Figure 7D:
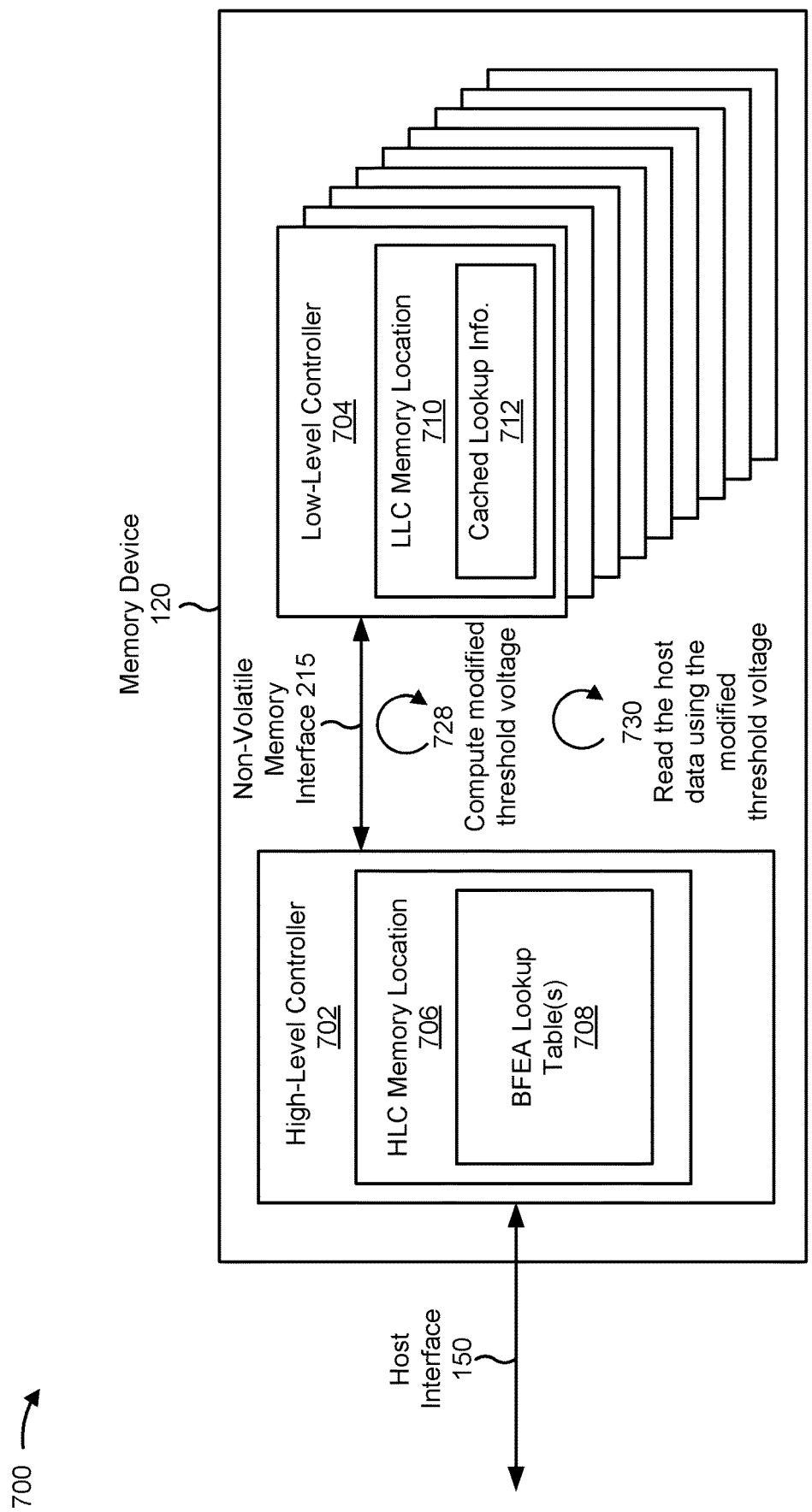

As shown in FIG. 7D, and as indicated by reference number 728, in some implementations, the memory device 120 (e.g., the low-level controller 704 thereof) may compute a modified threshold voltage associated with read command described above in connection with reference number 724. More particularly, the memory device 120 may compute the modified threshold voltage by applying the threshold voltage offset to a base read level voltage associated with the host data, in a similar manner described above in connection with FIGS. 4-5. Moreover, as shown by reference number 730, the memory device 120 may read, using the modified threshold voltage, the host data from the first memory location. In this way, the memory device 120 may perform an accurate read operation even if a threshold voltage has shifted due to SCL or the like, because the memory device 120 may compensate for any change in stored voltage via application of the threshold voltage offset.

Figure 7E:
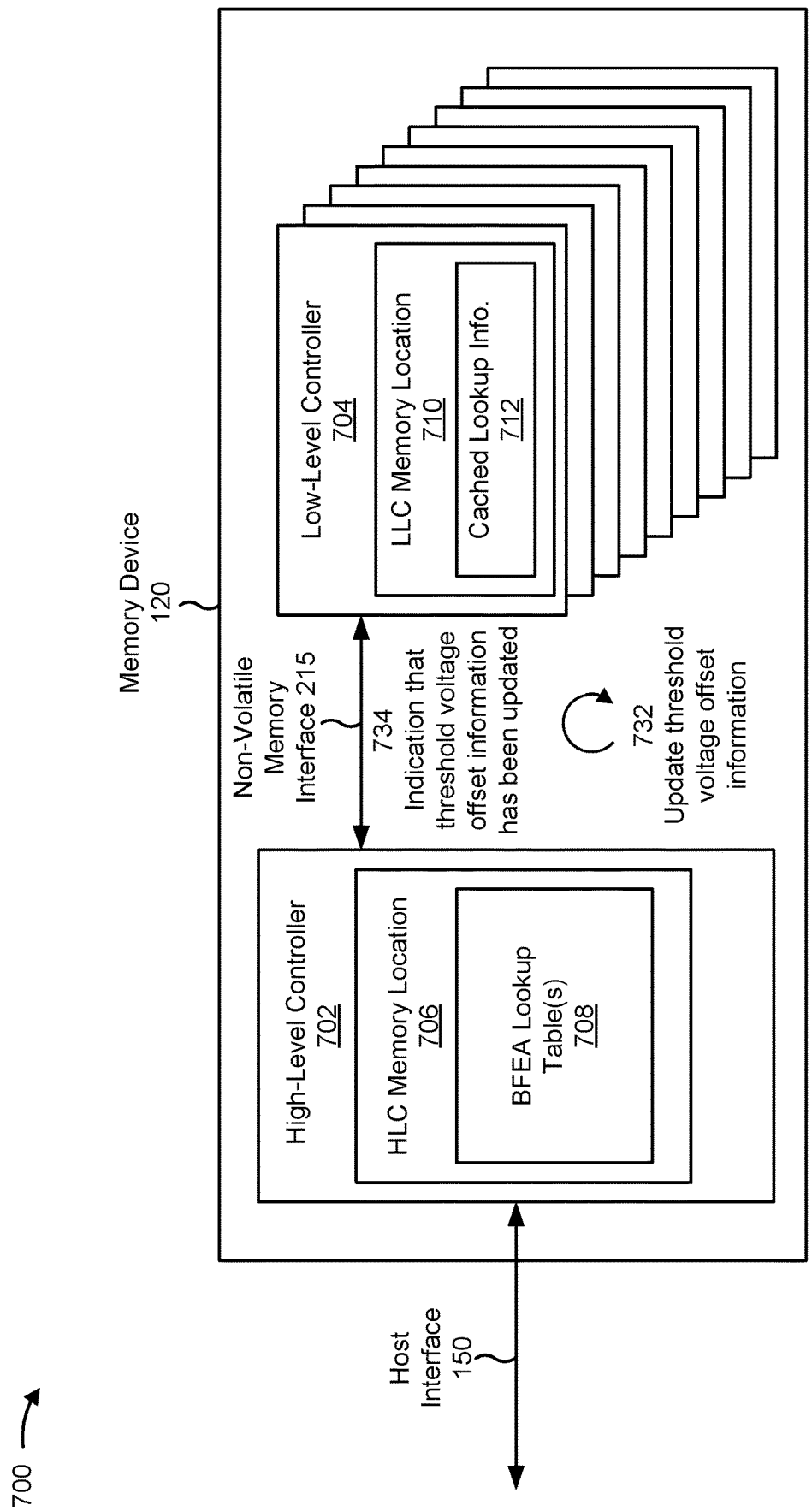

In some implementations, the memory device 120 may periodically update a threshold voltage offset associated with a block family, such as when enough time has elapsed that the block family should be associated with a different bin value, or the like. Accordingly, as shown in FIG. 7E, and as indicated by reference number 732, the memory device 120 may update threshold voltage offset information in the one or more BFEA lookup tables 708 (e.g., the block family table 606) stored in the second memory location (e.g., the HLC memory location 706). For example, in some implementations, the memory device 120 may determine, based on a period of time elapsing, that threshold voltage offset information associated with the block family should be updated, and/or the memory device 120 may update the threshold voltage offset information by updating the one or more BFEA lookup tables 708 associated with the second memory location. In such examples, the cached lookup information 712, which cached the original bin value, may become outdated. Thus, in some implementations, the memory device 120 may synchronize the cached lookup information 712 when information associated with a block family associated with host data stored in the LLC memory location 710 is updated in the one or more BFEA lookup tables 708.

Figure 7F:
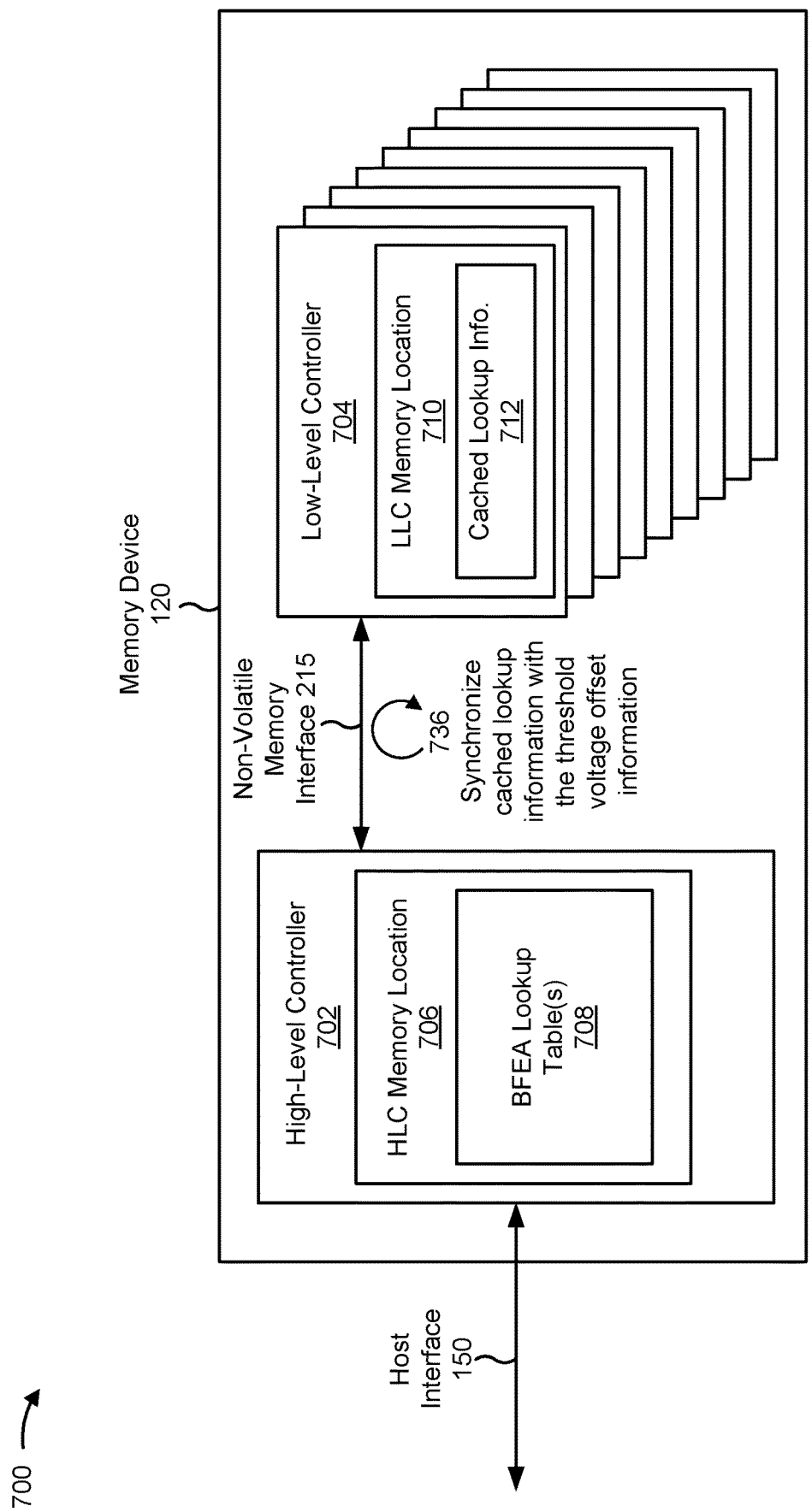

More particularly, as indicated by reference number 734, in some aspects the memory device 120 (and, more particularly, the low-level controller 704 of the memory device 120) may receive an indication (e.g., from the high-level controller 702 via the non-volatile memory interface 215) that threshold voltage offset information associated with the block family has been updated. Accordingly, as shown in FIG. 7F, and as indicated by reference number 736, the memory device 120 may synchronize the cached lookup information 712 to include the updated threshold offset information, or the like. More particularly, in some implementations, the memory device 120 may synchronize the subset of the one or more BFEA lookup tables with the threshold voltage offset information associated with the block family based on the indication that threshold voltage offset information associated with the block family has been updated. In that regard, if the memory device 120 receives a subsequent read command for the host data, the memory device 120 may apply the updated threshold voltage offset associated with the block family associated with the host data to determine a modified read reference value.

Figure 7G:
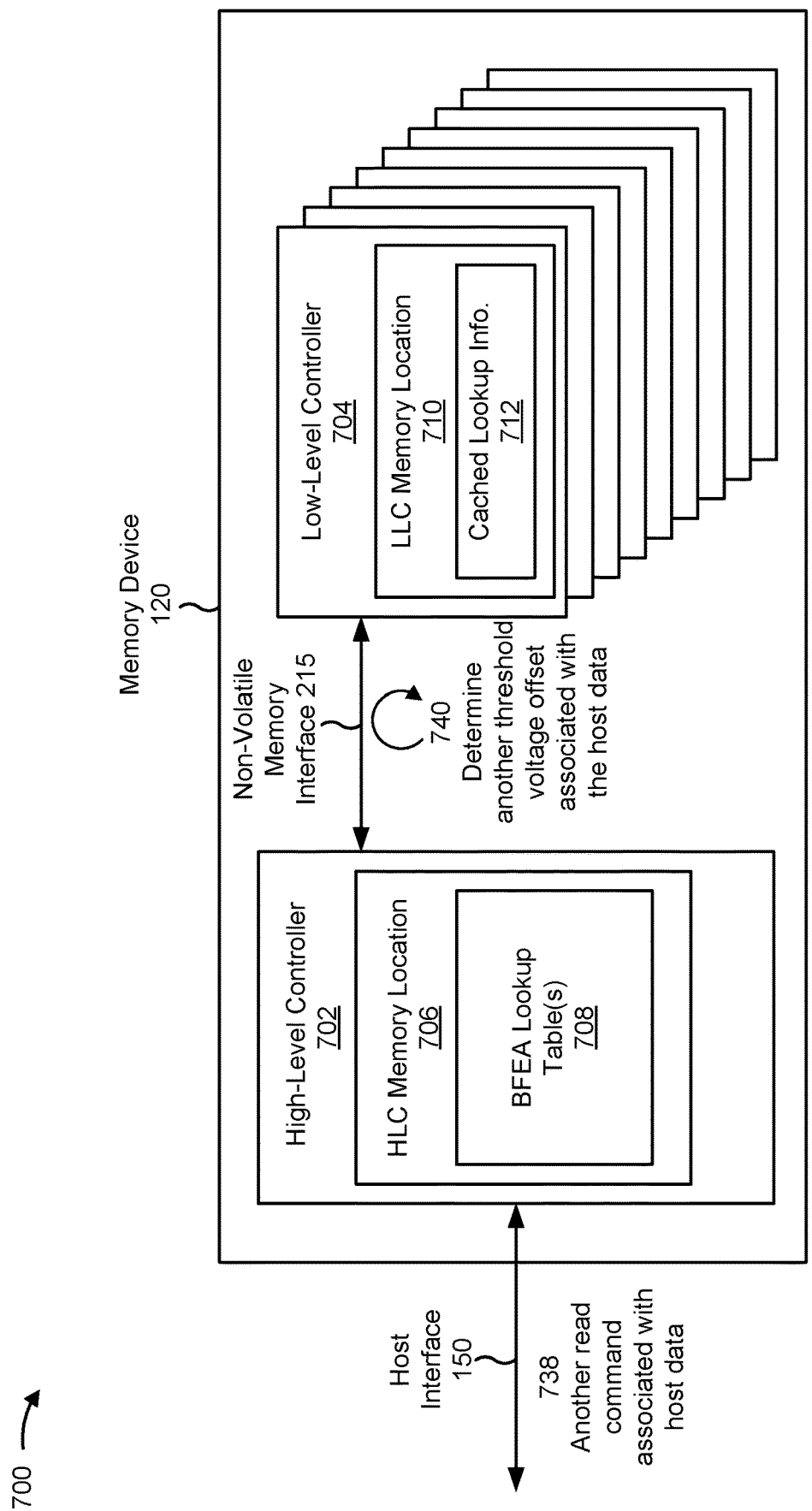
Figure 7H:
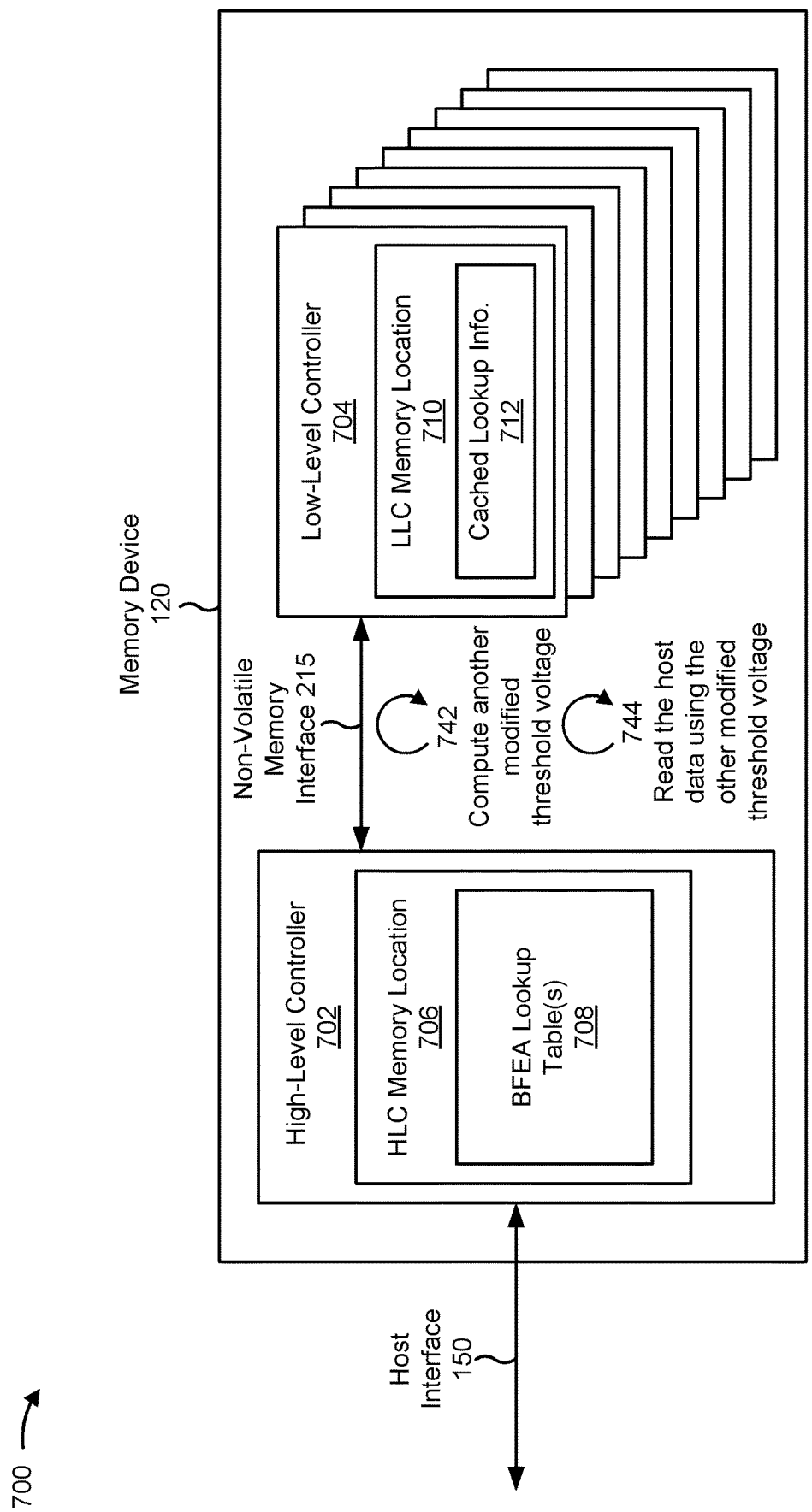

More particularly, as shown in FIG. 7G, and as indicated by reference number 738, the memory device 120 may receive, from the host device (e.g., via the host interface 150) another read command associated with host data. As shown by reference number 740, the memory device 120 may determine, based on the block family and the subset of the one or more BFEA tables cached in the first memory location, another threshold voltage offset associated with the host data. In this example, because the cached lookup information 712 has been updated in the manner described above, the other threshold voltage offset may be different than the threshold voltage offset described above in connection with reference number 726. As shown in FIG. 7H, and as indicated by reference number 742, the memory device 120 may thus compute another modified threshold voltage by applying the other threshold voltage offset to the base read level voltage associated with the host data. And, as indicated by reference number 744, the memory device 120 may read, using the other modified threshold voltage, the host data from the first memory location.

Based on the memory device 120 caching a relevant portion of the one or more BFEA lookup tables 708 in a memory location associated with a low-level controller 704, the memory device 120 may conserve computing and power resources that may have otherwise been consumed by performing a BFEA process. For example, based on the memory device 120 caching a relevant portion of the one or more BFEA lookup tables 708 in a memory location associated with a low-level controller 704, the memory device 120 may reduce a lookup time associated with determining a threshold offset value associated with block family of a host data to be read, thereby reducing cycle time and power consumption associated with performing one or more BFEA lookup processes.

As indicated above, FIGS. 7A-7H are provided as an example. Other examples may differ from what is described with regard to FIGS. 7A-7H. The number and arrangement of components shown in FIGS. 7A-7H are provided as an example. In practice, there may be additional components, fewer components, different components, or differently arranged components than those shown in FIGS. 7A-7H. Furthermore, two or more components shown in FIGS. 7A-7H may be implemented within a single component, or a single component shown in FIGS. 7A-7H may be implemented as multiple, distributed components. Additionally, or alternatively, a set of components (e.g., one or more components) shown in FIGS. 7A-7H may perform one or more functions described as being performed by another set of components shown in FIGS. 7A-7H.

Figure 8:
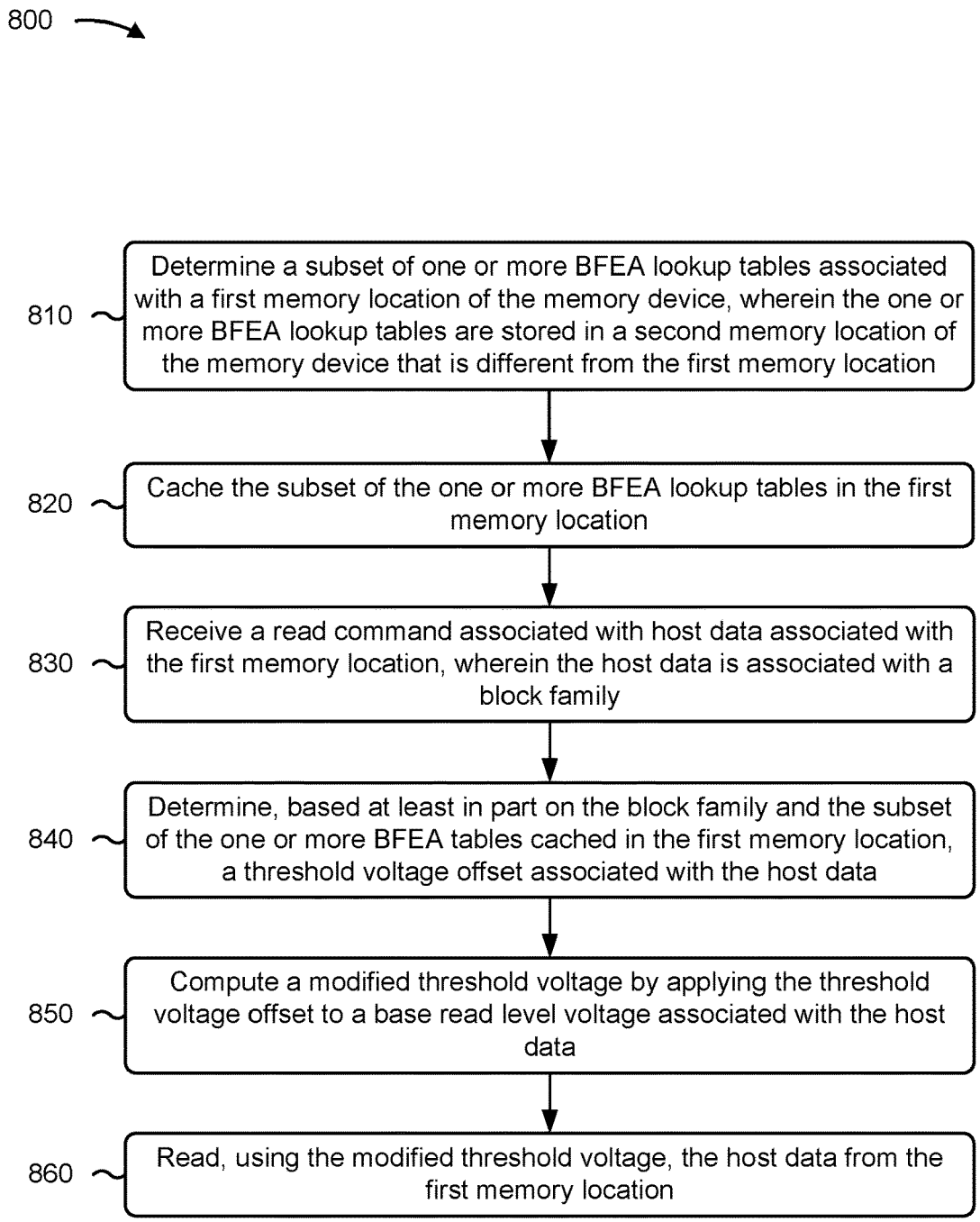
FIG. 8 is a flowchart of an example method associated with caching lookup tables for block family error avoidance.

FIG. 8 is a flowchart of an example method 800 associated with caching lookup tables for block family error avoidance. In some implementations, a memory device (e.g., the memory device 120) may perform or may be configured to perform the method 800. In some implementations, another device or a group of devices separate from or including the memory device (e.g., the system 100) may perform or may be configured to perform the method 800. Additionally, or alternatively, one or more components of the memory device (e.g., the controller 130, the memory management component 225, the block family manager component 230, the high-level controller 702, and/or the low-level controller 704) may perform or may be configured to perform the method 800. Thus, means for performing the method 800 may include the memory device 120 and/or one or more components of the memory device 120. Additionally, or alternatively, a non-transitory computer-readable medium may store one or more instructions that, when executed by the memory device 120 (e.g., the controller 130 of the memory device 120, the high-level controller 702 of the memory device 120, and/or the low-level controller 704 of the memory device 120), cause the memory device 120 to perform the method 800.

As shown in FIG. 8, the method 800 may include determining a subset of one or more BFEA lookup tables associated with a first memory location of the memory device, wherein the one or more BFEA lookup tables are stored in a second memory location of the memory device that is different from the first memory location (block 810). As further shown in FIG. 8, the method 800 may include caching the subset of the one or more BFEA lookup tables in the first memory location (block 820). As further shown in FIG. 8, the method 800 may include receiving a read command associated with host data associated with the first memory location, wherein the host data is associated with a block family (block 830). As further shown in FIG. 8, the method 800 may include determining, based on the block family and the subset of the one or more BFEA tables cached in the first memory location, a threshold voltage offset associated with the host data (block 840). As further shown in FIG. 8, the method 800 may include computing a modified threshold voltage by applying the threshold voltage offset to a base read level voltage associated with the host data (block 850). As further shown in FIG. 8, the method 800 may include reading, using the modified threshold voltage, the host data from the first memory location (block 860).

The method 800 may include additional aspects, such as any single aspect or any combination of aspects described below and/or described in connection with one or more other methods or operations described elsewhere herein.

In a first aspect, determining the threshold voltage offset associated with the host data includes associating a block family identifier associated with the host data with the threshold voltage offset based on the subset of the one or more BFEA tables cached in the first memory location.

In a second aspect, alone or in combination with the first aspect, the method 800 includes receiving an indication that threshold voltage offset information associated with the block family has been updated, and synchronizing the subset of the one or more BFEA lookup tables with the threshold voltage offset information associated with the block family based on the indication.

In a third aspect, alone or in combination with one or more of the first and second aspects, the method 800 includes receiving another read command associated with host data, determining, based on the block family and the subset of the one or more BFEA tables cached in the first memory location, another threshold voltage offset associated with the host data, wherein the other threshold voltage offset is different than the threshold voltage offset, computing another modified threshold voltage by applying the other threshold voltage offset to the base read level voltage associated with the host data, and reading, using the other modified threshold voltage, the host data from the first memory location.

In a fourth aspect, alone or in combination with one or more of the first through third aspects, the block family includes a plurality of blocks that are associated with at least one of a time window during which the host data was written to the first memory location or a temperature window at which the host data was written to the first memory location.

In a fifth aspect, alone or in combination with one or more of the first through fourth aspects, the method 800 includes determining, based on a period of time elapsing, that threshold voltage offset information associated with the block family should be updated, and updating the threshold voltage offset information by updating the one or more BFEA lookup tables associated with the second memory location.

In a sixth aspect, alone or in combination with one or more of the first through fifth aspects, the one or more BFEA lookup tables include at least a block partition table and a block family table, and wherein the subset of the one or more BFEA tables cached in the first memory location includes a first subset of the block partition table and a second subset of the block family table.

Although FIG. 8 shows example blocks of a method 800, in some implementations, the method 800 may include additional blocks, fewer blocks, different blocks, or differently arranged blocks than those depicted in FIG. 8. Additionally, or alternatively, two or more of the blocks of the method 800 may be performed in parallel. The method 800 is an example of one method that may be performed by one or more devices described herein. These one or more devices may perform or may be configured to perform one or more other methods based on operations described herein.

Figure 9:
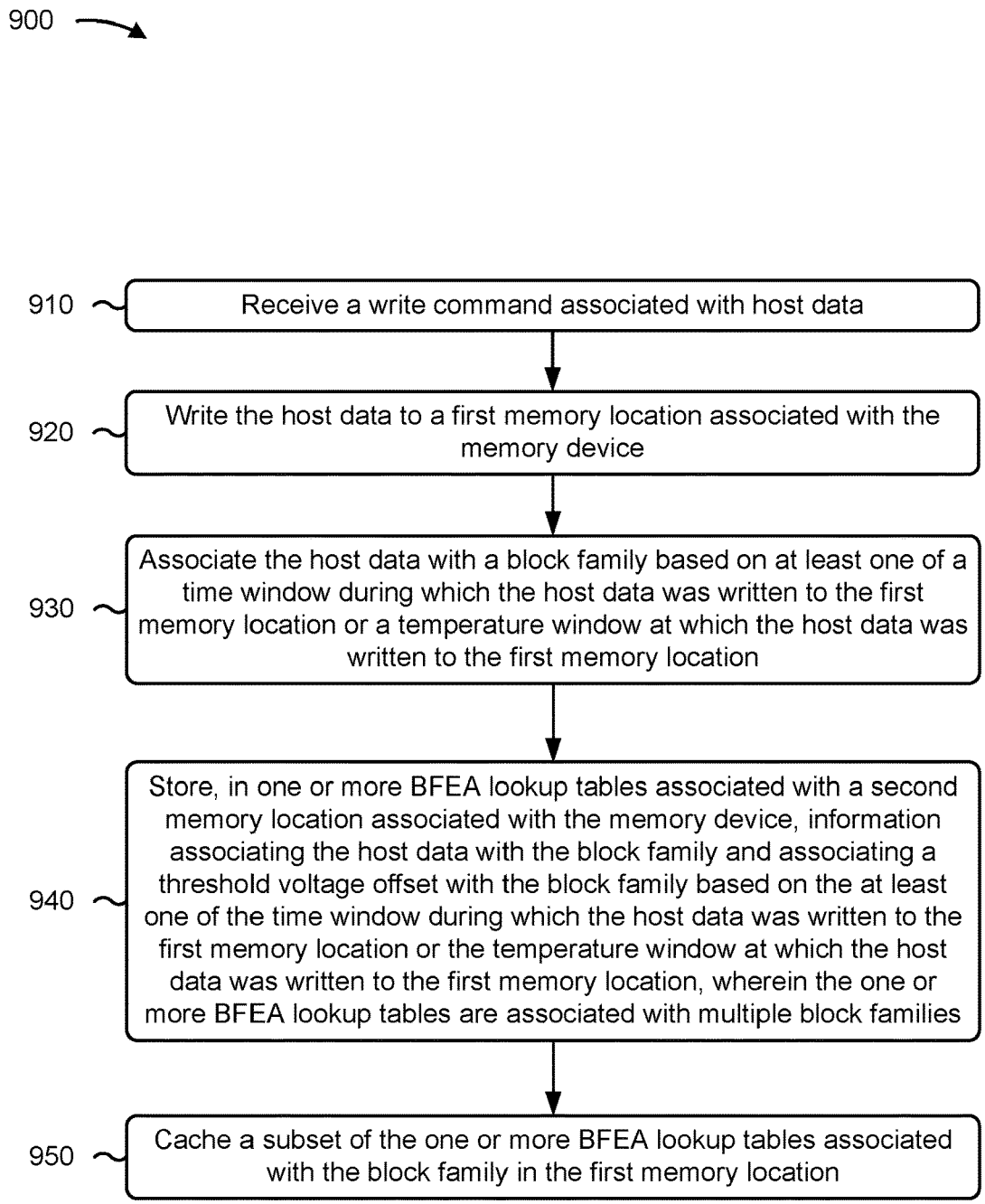
FIG. 9 is a flowchart of an example method associated with caching lookup tables for block family error avoidance.

FIG. 9 is a flowchart of an example method 900 associated with caching lookup tables for block family error avoidance. In some implementations, a memory device (e.g., the memory device 120) may perform or may be configured to perform the method 900. In some implementations, another device or a group of devices separate from or including the memory device (e.g., the system 100) may perform or may be configured to perform the method 900.

Additionally, or alternatively, one or more components of the memory device (e.g., the controller 130, the memory management component 225, the block family manager component 230, the high-level controller 702, and/or the low-level controller 704) may perform or may be configured to perform the method 900. Thus, means for performing the method 900 may include the memory device and/or one or more components of the memory device. Additionally, or alternatively, a non-transitory computer-readable medium may store one or more instructions that, when executed by the memory device (e.g., the controller 130 of the memory device 120, the high-level controller 702 of the memory device 120, and/or the low-level controller 704 of the memory device 120), cause the memory device to perform the method 900.

As shown in FIG. 9, the method 900 may include receiving a write command associated with host data (block 910). As further shown in FIG. 9, the method 900 may include writing the host data to the first memory location (block 920). As further shown in FIG. 9, the method 900 may include associating the host data with a block family based on at least one of a time window during which the host data was written to the first memory location or a temperature window at which the host data was written to the first memory location (block 930). As further shown in FIG. 9, the method 900 may include storing, in one or more BFEA lookup tables associated with the second memory location, information associating the host data with the block family and associating a threshold voltage offset with the block family based on the at least one of the time window during which the host data was written to the first memory location or the temperature window at which the host data was written to the first memory location, wherein the one or more BFEA lookup tables are associated with multiple block families (block 940). As further shown in FIG. 9, the method 900 may include caching a subset of the one or more BFEA lookup tables associated with the block family in the first memory location (block 950).

The method 900 may include additional aspects, such as any single aspect or any combination of aspects described below and/or described in connection with one or more other methods or operations described elsewhere herein.

In a first aspect, the method 900 includes receiving a read command associated with host data, determining, based on the block family and the subset of the one or more BFEA tables cached in the first memory location, the threshold voltage offset associated with the host data, computing a modified threshold voltage by applying the threshold voltage offset to a base read level voltage associated with the host data, and reading, using the modified threshold voltage, the host data from the first memory location.

In a second aspect, alone or in combination with the first aspect, determining the threshold voltage offset associated with the host data includes associating a block family identifier associated with the host data with the threshold voltage offset based on the subset of the one or more BFEA tables cached in the first memory location.

In a third aspect, alone or in combination with one or more of the first and second aspects, the method 900 includes receiving an indication that threshold voltage offset information associated with the block family has been updated, and synchronizing the subset of the one or more BFEA lookup tables with the threshold voltage offset information associated with the block family based on the indication.

In a fourth aspect, alone or in combination with one or more of the first through third aspects, the method 900 includes receiving another read command associated with host data, determining, based on the block family and the subset of the one or more BFEA tables cached in the first memory location, another threshold voltage offset associated with the host data, wherein the other threshold voltage offset is different than the threshold voltage offset, computing another modified threshold voltage by applying the other threshold voltage offset to the base read level voltage associated with the host data, and reading, using the other modified threshold voltage, the host data from the first memory location.

In a fifth aspect, alone or in combination with one or more of the first through fourth aspects, the block family includes a plurality of blocks that are associated with the at least one of the time window during which the host data was written to the first memory location or the temperature window at which the host data was written to the first memory location.

In a sixth aspect, alone or in combination with one or more of the first through fifth aspects, the method 900 includes determining, based on a period of time elapsing, that threshold voltage offset information associated with the block family should be updated, and updating the threshold voltage offset information by updating the one or more BFEA lookup tables associated with the second memory location.

In a seventh aspect, alone or in combination with one or more of the first through sixth aspects, the one or more BFEA lookup tables include at least a block partition table and a block family table, and wherein the subset of the one or more BFEA tables cached in the first memory location includes a first subset of the block partition table and a second subset of the block family table.

Although FIG. 9 shows example blocks of a method 900, in some implementations, the method 900 may include additional blocks, fewer blocks, different blocks, or differently arranged blocks than those depicted in FIG. 9. Additionally, or alternatively, two or more of the blocks of the method 900 may be performed in parallel. The method 900 is an example of one method that may be performed by one or more devices described herein. These one or more devices may perform or may be configured to perform one or more other methods based on operations described herein.

Figure 10:
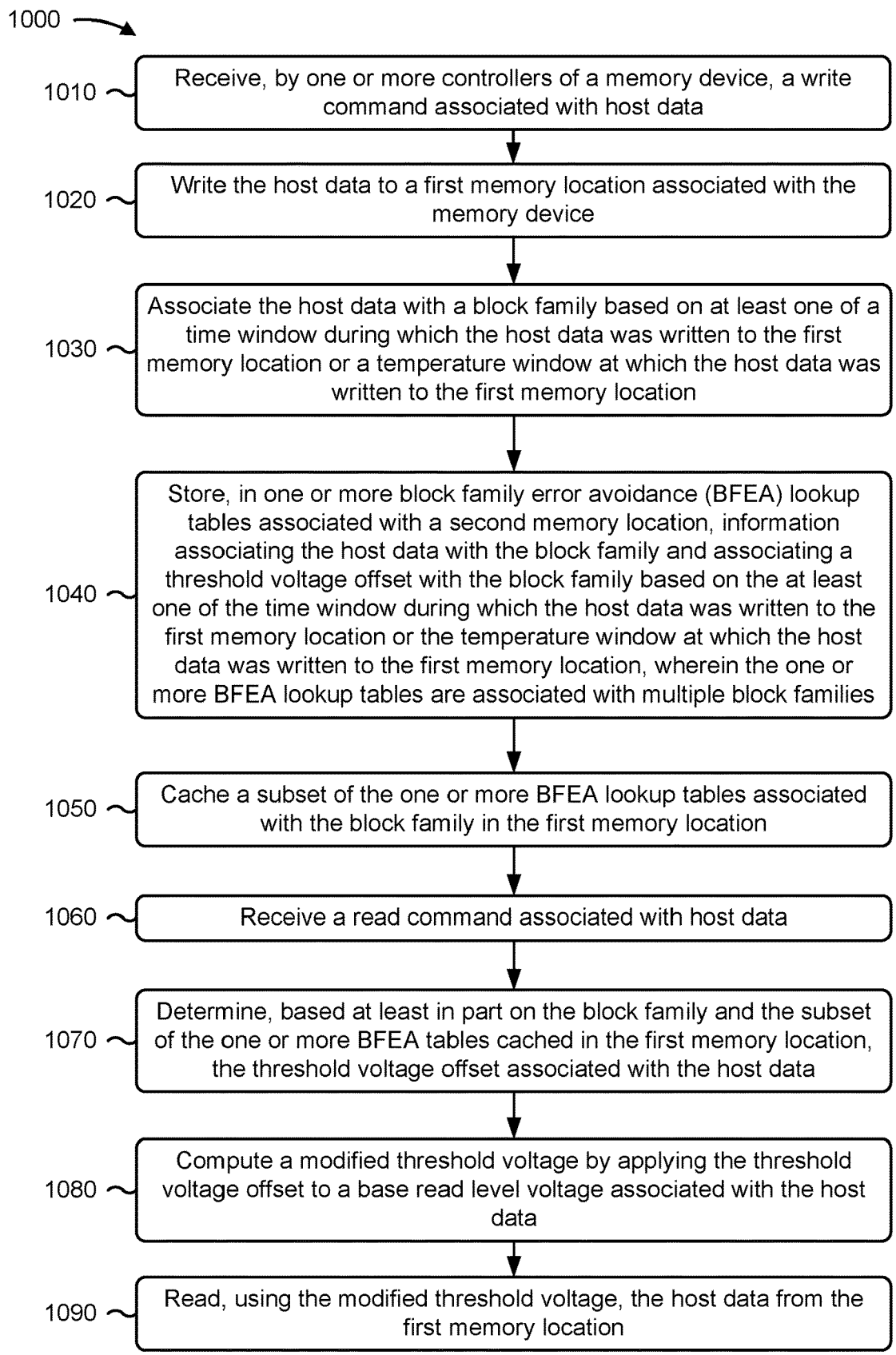
FIG. 10 is a flowchart of an example method associated with caching lookup tables for block family error avoidance.

FIG. 10 is a flowchart of an example method 1000 associated with caching lookup tables for block family error avoidance. In some implementations, a memory device (e.g., the memory device 120) may perform or may be configured to perform the method 1000. In some implementations, another device or a group of devices separate from or including the memory device (e.g., the system 100) may perform or may be configured to perform the method 1000. Additionally, or alternatively, one or more components of the memory device (e.g., the controller 130, the memory management component 225, the block family manager component 230, the high-level controller 702, and/or the low-level controller 704) may perform or may be configured to perform the method 1000. Thus, means for performing the method 1000 may include the memory device and/or one or more components of the memory device. Additionally, or alternatively, a non-transitory computer-readable medium may store one or more instructions that, when executed by the memory device (e.g., the controller 130 of the memory device 120, the high-level controller 702 of the memory device 120, and/or the low-level controller 704 of the memory device 120), cause the memory device to perform the method 1000.

As shown in FIG. 10, the method 1000 may include receiving, by one or more controllers of a memory device, a write command associated with host data (block 1010). As further shown in FIG. 10, the method 1000 may include writing the host data to a first memory location associated with the memory device (block 1020). As further shown in FIG. 10, the method 1000 may include associating the host data with a block family based on at least one of a time window during which the host data was written to the first memory location or a temperature window at which the host data was written to the first memory location (block 1030). As further shown in FIG. 10, the method 1000 may include storing, in one or more BFEA lookup tables associated with a second memory location, information associating the host data with the block family and associating a threshold voltage offset with the block family based on the at least one of the time window during which the host data was written to the first memory location or the temperature window at which the host data was written to the first memory location, wherein the one or more BFEA lookup tables are associated with multiple block families (block 1040). As further shown in FIG. 10, the method 1000 may include caching a subset of the one or more BFEA lookup tables associated with the block family in the first memory location (block 1050). As further shown in FIG. 10, the method 1000 may include receiving a read command associated with host data (block 1060). As further shown in FIG. 10, the method 1000 may include determining, based on the block family and the subset of the one or more BFEA tables cached in the first memory location, the threshold voltage offset associated with the host data (block 1070). As further shown in FIG. 10, the method 1000 may include computing a modified threshold voltage by applying the threshold voltage offset to a base read level voltage associated with the host data (block 1080). As further shown in FIG. 10, the method 1000 may include reading, using the modified threshold voltage, the host data from the first memory location (block 1090).

The method 1000 may include additional aspects, such as any single aspect or any combination of aspects described below and/or described in connection with one or more other methods or operations described elsewhere herein.

In a first aspect, determining the threshold voltage offset associated with the host data includes associating a block family identifier associated with the host data with the threshold voltage offset based on the subset of the one or more BFEA tables cached in the first memory location.

In a second aspect, alone or in combination with the first aspect, the method 1000 includes receiving, by the one or more controllers of the memory device, an indication that threshold voltage offset information associated with the block family has been updated, and synchronizing, by the one or more controllers of the memory device, the subset of the one or more BFEA lookup tables with the threshold voltage offset information associated with the block family based on the indication.

In a third aspect, alone or in combination with one or more of the first and second aspects, the method 1000 includes receiving, by the one or more controllers of the memory device, another read command associated with host data, determining, by the one or more controllers of the memory device and based on the block family and the subset of the one or more BFEA tables cached in the first memory location, another threshold voltage offset associated with the host data, wherein the other threshold voltage offset is different than the threshold voltage offset, computing, by the one or more controllers of the memory device, another modified threshold voltage by applying the other threshold voltage offset to the base read level voltage associated with the host data, and reading, by the one or more controllers of the memory device and using the other modified threshold voltage, the host data from the first memory location.

In a fourth aspect, alone or in combination with one or more of the first through third aspects, the block family includes a plurality of blocks that are associated with the at least one of the time window during which the host data was written to the first memory location or the temperature window at which the host data was written to the first memory location.

In a fifth aspect, alone or in combination with one or more of the first through fourth aspects, the method 1000 includes determining, by the one or more controllers of the memory device and based on a period of time elapsing, that threshold voltage offset information associated with the block family should be updated, and updating, by the one or more controllers of the memory device, the threshold voltage offset information by updating the one or more BFEA lookup tables associated with the second memory location.

In a sixth aspect, alone or in combination with one or more of the first through fifth aspects, the one or more BFEA lookup tables include at least a block partition table and a block family table, and wherein the subset of the one or more BFEA tables cached in the first memory location includes a first subset of the block partition table and a second subset of the block family table.

Although FIG. 10 shows example blocks of a method 1000, in some implementations, the method 1000 may include additional blocks, fewer blocks, different blocks, or differently arranged blocks than those depicted in FIG. 10. Additionally, or alternatively, two or more of the blocks of the method 1000 may be performed in parallel. The method 1000 is an example of one method that may be performed by one or more devices described herein. These one or more devices may perform or may be configured to perform one or more other methods based on operations described herein.

In some implementations, a memory device includes one or more components configured to: determine a subset of one or more BFEA lookup tables associated with a first memory location of the memory device, wherein the one or more BFEA lookup tables are stored in a second memory location of the memory device that is different from the first memory location; cache the subset of the one or more BFEA lookup tables in the first memory location; receive a read command associated with host data associated with the first memory location, wherein the host data is associated with a block family; determine, based on the block family and the subset of the one or more BFEA tables cached in the first memory location, a threshold voltage offset associated with the host data; compute a modified threshold voltage by applying the threshold voltage offset to a base read level voltage associated with the host data; and read, using the modified threshold voltage, the host data from the first memory location.

In some implementations, a memory device includes memory including at least a first memory location and a second memory location; and a plurality of controllers operatively coupled to the memory and including at least a low-level controller associated with the first memory location and a high-level controller associated with the second memory location, the plurality of controllers configured to: receive a write command associated with host data; write the host data to the first memory location; associate the host data with a block family based on at least one of a time window during which the host data was written to the first memory location or a temperature window at which the host data was written to the first memory location; store, in one or more BFEA lookup tables associated with the second memory location, information associating the host data with the block family and associating a threshold voltage offset with the block family based on the at least one of the time window during which the host data was written to the first memory location or the temperature window at which the host data was written to the first memory location, wherein the one or more BFEA lookup tables are associated with multiple block families; and cache a subset of the one or more BFEA lookup tables associated with the block family in the first memory location.

In some implementations, a method includes receiving, by one or more controllers of a memory device, a write command associated with host data; writing, by the one or more controllers of a memory device, the host data to a first memory location associated with the memory device; associating, by the one or more controllers of the memory device, the host data with a block family based on at least one of a time window during which the host data was written to the first memory location or a temperature window at which the host data was written to the first memory location; storing, by the one or more controllers of the memory device and in one or more BFEA lookup tables associated with a second memory location, information associating the host data with the block family and associating a threshold voltage offset with the block family based on the at least one of the time window during which the host data was written to the first memory location or the temperature window at which the host data was written to the first memory location, wherein the one or more BFEA lookup tables are associated with multiple block families; caching, by the one or more controllers of the memory device, a subset of the one or more BFEA lookup tables associated with the block family in the first memory location; receiving, by the one or more controllers of the memory device, a read command associated with host data; determining, by the one or more controllers of the memory device and based on the block family and the subset of the one or more BFEA tables cached in the first memory location, the threshold voltage offset associated with the host data; computing, by the one or more controllers of the memory device, a modified threshold voltage by applying the threshold voltage offset to a base read level voltage associated with the host data; and reading, by the one or more controllers of the memory device and using the modified threshold voltage, the host data from the first memory location.

In some implementations, an apparatus includes means for determining a subset of one or more BFEA lookup tables associated with a first memory location of a memory device, wherein the one or more BFEA lookup tables are stored in a second memory location of the memory device that is different from the first memory location; means for caching the subset of the one or more BFEA lookup tables in the first memory location; means for receiving a read command associated with host data associated with first memory location, wherein the host data is associated with a block family; means for determining, based on the block family and the subset of the one or more BFEA tables cached in the first memory location, a threshold voltage offset associated with the host data; means for computing a modified threshold voltage by applying the threshold voltage offset to a base read level voltage associated with the host data; and means for reading, using the modified threshold voltage, the host data from the first memory location.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the term "approximately" means "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
one or more components configured to:
  determine a subset of one or more block family error avoidance (BFEA) lookup tables associated with a first memory location of the memory device, wherein the one or more BFEA lookup tables are stored in a second memory location of the memory device that is different from the first memory location;
  cache the subset of the one or more BFEA lookup tables in the first memory location;
  receive a read command associated with host data associated with the first memory location, wherein the host data is associated with a block family;
  determine, based on the block family and the subset of the one or more BFEA tables cached in the first memory location, a threshold voltage offset associated with the host data;

compute a modified threshold voltage by applying the threshold voltage offset to a base read level voltage associated with the host data; and read, using the modified threshold voltage, the host data from the first memory location.

2. The memory device of claim 1, wherein determining the threshold voltage offset associated with the host data includes associating a block family identifier associated with the host data with the threshold voltage offset based on the subset of the one or more BFEA tables cached in the first memory location.

3. The memory device of claim 1, wherein the one or more components are further configured to:

receive an indication that threshold voltage offset information associated with the block family has been updated; and synchronize the subset of the one or more BFEA lookup tables with the threshold voltage offset information associated with the block family based on the indication.

4. The memory device of claim 3, wherein the one or more components are further configured to:

receive another read command associated with host data;

determine, based on the block family and the subset of the one or more BFEA tables cached in the first memory location, another threshold voltage offset associated with the host data, wherein the other threshold voltage offset is different than the threshold voltage offset;

compute another modified threshold voltage by applying the other threshold voltage offset to the base read level voltage associated with the host data; and read, using the other modified threshold voltage, the host data from the first memory location.

5. The memory device of claim 1, wherein the block family includes a plurality of blocks that are associated with at least one of a time window during which the host data was written to the first memory location or a temperature window at which the host data was written to the first memory location.

6. The memory device of claim 1, wherein the one or more components are further configured to:

determine, based on a period of time elapsing, that threshold voltage offset information associated with the block family should be updated; and update the threshold voltage offset information by updating the one or more BFEA lookup tables associated with the second memory location.

7. The memory device of claim 1, wherein the one or more BFEA lookup tables include at least a block partition table and a block family table, and wherein the subset of the one or more BFEA tables cached in the first memory location includes a first subset of the block partition table and a second subset of the block family table.

8. A memory device, comprising:

memory including at least a first memory location and a second memory location; and a plurality of controllers operatively coupled to the memory and including at least a low-level controller associated with the first memory location and a high-level controller associated with the second memory location, the plurality of controllers configured to:

receive a write command associated with host data;

write the host data to the first memory location;

associate the host data with a block family based on at least one of a time window during which the host data was written to the first memory location or a temperature window at which the host data was written to the first memory location;

store, in one or more block family error avoidance (BFEA) lookup tables associated with the second memory location, information associating the host data with the block family and associating a threshold voltage offset with the block family, wherein the one or more BFEA lookup tables are associated with multiple block families;

cache a subset of the one or more BFEA lookup tables associated with the block family in the first memory location; and read the host data from the first memory location using a modified threshold voltage that is obtained based on applying the threshold voltage offset to a base read level voltage associated with the host data.

9. The memory device of claim 8, wherein the plurality of controllers are further configured to:

receive a read command associated with host data;

determine, based on the block family and the subset of the one or more BFEA tables cached in the first memory location, the threshold voltage offset associated with the host data; and compute the modified threshold voltage by applying the threshold voltage offset to the base read level voltage.

10. The memory device of claim 9, wherein determining the threshold voltage offset associated with the host data includes associating a block family identifier associated with the host data with the threshold voltage offset based on the subset of the one or more BFEA tables cached in the first memory location.

11. The memory device of claim 9, wherein the plurality of controllers are further configured to:

receive an indication that threshold voltage offset information associated with the block family has been updated; and synchronize the subset of the one or more BFEA lookup tables with the threshold voltage offset information associated with the block family based on the indication.

12. The memory device of claim 11, wherein the plurality of controllers are further configured to:

receive another read command associated with host data;

determine, based on the block family and the subset of the one or more BFEA tables cached in the first memory location, another threshold voltage offset associated with the host data, wherein the other threshold voltage offset is different than the threshold voltage offset;

compute another modified threshold voltage by applying the other threshold voltage offset to the base read level voltage associated with the host data; and read, using the other modified threshold voltage, the host data from the first memory location.

13. The memory device of claim 8, wherein the block family includes a plurality of blocks that are associated with the at least one of the time window during which the host data was written to the first memory location or the temperature window at which the host data was written to the first memory location.

14. The memory device of claim 8, wherein the plurality of controllers are further configured to:

determine, based on a period of time elapsing, that threshold voltage offset information associated with the block family should be updated; and update the threshold voltage offset information by updating the one or more BFEA lookup tables associated with the second memory location.

15. The memory device of claim 8, wherein the one or more BFEA lookup tables include at least a block partition table and a block family table, and wherein the subset of the one or more BFEA tables cached in the first memory location includes a first subset of the block partition table and a second subset of the block family table.

16. A method, comprising:
receiving, by one or more controllers of a memory device, a write command associated with host data;
writing, by the one or more controllers of the memory device, the host data to a first memory location associated with the memory device;
associating, by the one or more controllers of the memory device, the host data with a block family based on at least one of a time window during which the host data was written to the first memory location or a temperature window at which the host data was written to the first memory location;
storing, by the one or more controllers of the memory device and in one or more block family error avoidance (BFEA) lookup tables associated with a second memory location, information associating the host data with the block family and associating a threshold voltage offset with the block family based on the at least one of the time window during which the host data was written to the first memory location or the temperature window at which the host data was written to the first memory location, wherein the one or more BFEA lookup tables are associated with multiple block families;
caching, by the one or more controllers of the memory device, a subset of the one or more BFEA lookup tables associated with the block family in the first memory location;
receiving, by the one or more controllers of the memory device, a read command associated with host data;
determining, by the one or more controllers of the memory device and based on the block family and the subset of the one or more BFEA tables cached in the first memory location, the threshold voltage offset associated with the host data;
computing, by the one or more controllers of the memory device, a modified threshold voltage by applying the threshold voltage offset to a base read level voltage associated with the host data; and
reading, by the one or more controllers of the memory device and using the modified threshold voltage, the host data from the first memory location.

17. The method of claim 16, wherein determining the threshold voltage offset associated with the host data includes associating a block family identifier associated with the host data with the threshold voltage offset based on the subset of the one or more BFEA tables cached in the first memory location.

18. The method of claim 16, further comprising:
receiving, by the one or more controllers of the memory device, an indication that threshold voltage offset information associated with the block family has been updated; and
synchronizing, by the one or more controllers of the memory device, the subset of the one or more BFEA lookup tables with the threshold voltage offset information associated with the block family based on the indication.

19. The method of claim 18, further comprising:
receiving, by the one or more controllers of the memory device, another read command associated with host data;
determining, by the one or more controllers of the memory device and based on the block family and the subset of the one or more BFEA tables cached in the first memory location, another threshold voltage offset associated with the host data, wherein the other threshold voltage offset is different than the threshold voltage offset;
computing, by the one or more controllers of the memory device, another modified threshold voltage by applying the other threshold voltage offset to the base read level voltage associated with the host data; and
reading, by the one or more controllers of the memory device and using the other modified threshold voltage, the host data from the first memory location.

20. The method of claim 16, wherein the block family includes a plurality of blocks that are associated with the at least one of the time window during which the host data was written to the first memory location or the temperature window at which the host data was written to the first memory location.

21. The method of claim 16, further comprising:
determining, by the one or more controllers of the memory device and based on a period of time elapsing, that threshold voltage offset information associated with the block family should be updated; and
updating, by the one or more controllers of the memory device, the threshold voltage offset information by updating the one or more BFEA lookup tables associated with the second memory location.

22. The method of claim 16, wherein the one or more BFEA lookup tables include at least a block partition table and a block family table, and wherein the subset of the one or more BFEA tables cached in the first memory location includes a first subset of the block partition table and a second subset of the block family table.

23. An apparatus, comprising:
means for determining a subset of one or more block family error avoidance (BFEA) lookup tables associated with a first memory location of a memory device, wherein the one or more BFEA lookup tables are stored in a second memory location of the memory device that is different from the first memory location;
means for caching the subset of the one or more BFEA lookup tables in the first memory location;
means for receiving a read command associated with host data associated with first memory location, wherein the host data is associated with a block family;
means for determining, based on the block family and the subset of the one or more BFEA tables cached in the first memory location, a threshold voltage offset associated with the host data;
means for computing a modified threshold voltage by applying the threshold voltage offset to a base read level voltage associated with the host data; and
means for reading, using the modified threshold voltage, the host data from the first memory location.

24. The apparatus of claim 23, wherein the means for determining the threshold voltage offset associated with the host data includes means for associating a block family identifier associated with the host data with the threshold voltage offset based on the subset of the one or more BFEA tables cached in the first memory location.

25. The apparatus of claim 23, further comprising:
means for receiving an indication that threshold voltage offset information associated with the block family has been updated; and
means for synchronizing the subset of the one or more BFEA lookup tables with the threshold voltage offset information associated with the block family based on the indication.

\* \* \* \* \*